US008993364B2

(12) United States Patent
Wiedeman et al.

(10) Patent No.: US 8,993,364 B2
(45) Date of Patent: Mar. 31, 2015

(54) INTEGRATED THIN FILM SOLAR CELL INTERCONNECTION

(71) Applicants: Global Solar Energy, Inc., Tucson, AZ (US); Hanergy Hi-Tech Power (HK) Limited, West KL (HK)

(72) Inventors: Scott Wiedeman, Tucson, AZ (US); Jeffrey S. Britt, Tucson, AZ (US); Zulima Rhodes, Tucson, AZ (US); Eric Sheehan, Tucson, AZ (US)

(73) Assignee: Hanergy Hi-Tech Power (HK) Limited, West KL (HK)

( * ) Notice: Subject to any disclaimer, the term of this patent is extended or adjusted under 35 U.S.C. 154(b) by 0 days.

(21) Appl. No.: 14/151,040

(22) Filed: Jan. 9, 2014

(65) Prior Publication Data

US 2014/0170798 A1   Jun. 19, 2014

Related U.S. Application Data

(63) Continuation of application No. 12/980,201, filed on Dec. 28, 2010, now abandoned.

(60) Provisional application No. 61/284,924, filed on Dec. 28, 2009, provisional application No. 61/284,956, filed on Dec. 28, 2009, provisional application No. 61/284,958, filed on Dec. 28, 2009.

(51) Int. Cl.
*H01L 21/00* (2006.01)
*H01L 31/05* (2014.01)
*H01L 31/048* (2014.01)
*H05K 1/18* (2006.01)

(52) U.S. Cl.
CPC .......... *H01L 31/0504* (2013.01); *H01L 31/048* (2013.01); *H01L 31/05* (2013.01); *Y02E 10/50* (2013.01); *H05K 1/181* (2013.01); *H05K 2201/10143* (2013.01); *H01L 31/0508* (2013.01); *H01L 31/0512* (2013.01)
USPC ............................................... 438/64; 438/66

(58) Field of Classification Search
None
See application file for complete search history.

(56) References Cited

U.S. PATENT DOCUMENTS 3,553,030 A   1/1971   Lebrun
4,064,552 A   12/1977  Angelucci et al.
(Continued)

FOREIGN PATENT DOCUMENTS

DE   3423172 A1   1/1985
DE   19652810 A1  7/1998
(Continued)

OTHER PUBLICATIONS

Apr. 5, 2011, Office action from the U.S. Patent and Trademark Office, in U.S. Appl. No. 12/364,440, which is another patent application of Global Solar Energy, Inc., 17 pages.
(Continued)

*Primary Examiner* — Scott B Geyer
(74) *Attorney, Agent, or Firm* — Kolisch Hartwell, P.C.

(57) ABSTRACT

Photovoltaic modules may include multiple flexible thin film photovoltaic cells electrically connected in series, and laminated to a substantially transparent top sheet having a conductive grid pattern facing the cells. Methods of manufacturing photovoltaic modules including integrated multi-cell interconnections are provided. Methods may include steps of coordinating, integrating, and registering multiple rolls of substrates in continuous processes.

12 Claims, 13 Drawing Sheets

(56) References Cited

U.S. PATENT DOCUMENTS

| | | |
|---|---|---|
| 4,221,465 A | 9/1980 | Hannan et al. |
| 4,254,546 A | 3/1981 | Ullery, Jr. |
| 4,318,938 A | 3/1982 | Barnett et al. |
| 4,400,577 A | 8/1983 | Spear |
| 4,430,519 A | 2/1984 | Young |
| 4,537,838 A | 8/1985 | Jetter et al. |
| 4,542,255 A | 9/1985 | Tanner et al. |
| 4,609,770 A | 9/1986 | Nishiura et al. |
| 4,617,420 A | 10/1986 | Dilts et al. |
| 4,617,421 A | 10/1986 | Nath et al. |
| 4,642,413 A | 2/1987 | Ovshinsky |
| 4,652,693 A | 3/1987 | Bar-On |
| 4,663,828 A | 5/1987 | Hanak |
| 4,663,829 A | 5/1987 | Hartman et al. |
| 4,697,041 A | 9/1987 | Okaniwa et al. |
| 4,698,455 A | 10/1987 | Cavicchi et al. |
| 4,713,493 A | 12/1987 | Ovshinsky |
| 4,737,379 A | 4/1988 | Hudgens et al. |
| 4,746,618 A | 5/1988 | Nath et al. |
| 4,773,944 A | 9/1988 | Nath et al. |
| 4,783,421 A | 11/1988 | Carlson et al. |
| 4,965,655 A | 10/1990 | Grimmer et al. |
| 5,021,099 A | 6/1991 | Kim et al. |
| 5,118,361 A | 6/1992 | Fraas et al. |
| 5,127,964 A | 7/1992 | Hamakawa et al. |
| 5,176,758 A | 1/1993 | Nath et al. |
| 5,181,968 A | 1/1993 | Nath et al. |
| 5,185,042 A | 2/1993 | Ferguson |
| 5,254,179 A | 10/1993 | Ricaud et al. |
| 5,268,037 A | 12/1993 | Glatfelter |
| 5,273,608 A | 12/1993 | Nath |
| 5,385,848 A | 1/1995 | Grimmer |
| 5,391,235 A | 2/1995 | Inoue |
| 5,409,549 A | 4/1995 | Mori |
| 5,419,781 A | 5/1995 | Hamakawa et al. |
| 5,457,057 A | 10/1995 | Nath et al. |
| 5,460,659 A | 10/1995 | Krut |
| 5,474,621 A | 12/1995 | Barnard |
| 5,534,094 A | 7/1996 | Arjavalingam et al. |
| 5,547,516 A | 8/1996 | Luch |
| 5,728,230 A | 3/1998 | Komori et al. |
| 5,735,966 A | 4/1998 | Luch |
| 5,928,437 A | 7/1999 | Dillard |
| 6,148,570 A | 11/2000 | Dinwoodie et al. |
| 6,239,352 B1 | 5/2001 | Luch |
| 6,310,281 B1 | 10/2001 | Wendt et al. |
| 6,372,538 B1 | 4/2002 | Wendt et al. |
| 6,414,235 B1 | 7/2002 | Luch |
| 6,459,032 B1 | 10/2002 | Luch |
| 6,479,744 B1 | 11/2002 | Tsuzuki et al. |
| 6,653,718 B2 | 11/2003 | Leung et al. |
| 6,690,041 B2 | 2/2004 | Armstrong et al. |
| 6,706,963 B2 | 3/2004 | Gaudiana et al. |
| 7,122,398 B1 | 10/2006 | Pichler |
| 7,176,543 B2 | 2/2007 | Beernink |
| 7,194,197 B1 | 3/2007 | Wendt et al. |
| 7,256,140 B2 | 8/2007 | Call et al. |
| 7,365,266 B2 | 4/2008 | Heckeroth |
| 7,432,438 B2 | 10/2008 | Rubin et al. |
| 7,485,474 B2 | 2/2009 | Call et al. |
| 7,498,508 B2 | 3/2009 | Rubin et al. |
| 7,507,903 B2 | 3/2009 | Luch |
| 7,517,465 B2 | 4/2009 | Guha et al. |
| 7,635,810 B2 | 12/2009 | Luch |
| 7,638,353 B2 | 12/2009 | Beernink et al. |
| 7,732,243 B2 | 6/2010 | Luch |
| 7,851,700 B2 | 12/2010 | Luch |
| 7,868,249 B2 | 1/2011 | Luch |
| 7,898,053 B2 | 3/2011 | Luch |
| 7,898,054 B2 | 3/2011 | Luch |
| 7,932,124 B2 | 4/2011 | Brabec et al. |
| 7,964,476 B2 | 6/2011 | Liu et al. |
| 7,989,692 B2 | 8/2011 | Luch |
| 7,989,693 B2 | 8/2011 | Luch |
| 8,062,922 B2 | 11/2011 | Britt et al. |
| 8,076,568 B2 | 12/2011 | Luch et al. |
| 8,110,737 B2 | 2/2012 | Luch |
| 8,114,702 B2 | 2/2012 | Gilman |
| 8,138,413 B2 | 3/2012 | Luch et al. |
| 8,198,696 B2 | 6/2012 | Luch |
| 8,202,368 B2 | 6/2012 | Britt et al. |
| 8,222,513 B2 | 7/2012 | Luch |
| 8,304,646 B2 | 11/2012 | Luch |
| 8,319,097 B2 | 11/2012 | Luch |
| 2001/0015220 A1 | 8/2001 | Benz et al. |
| 2001/0037823 A1* | 11/2001 | Middelman et al. .......... 136/251 |
| 2003/0213974 A1 | 11/2003 | Armstrong et al. |
| 2004/0069340 A1 | 4/2004 | Luch |
| 2005/0000561 A1 | 1/2005 | Baret et al. |
| 2005/0121067 A1 | 6/2005 | Toyomura et al. |
| 2005/0176270 A1 | 8/2005 | Luch |
| 2006/0032752 A1 | 2/2006 | Luch |
| 2006/0157103 A1 | 7/2006 | Sheats et al. |
| 2006/0174930 A1 | 8/2006 | Murphy et al. |
| 2006/0180195 A1 | 8/2006 | Luch |
| 2007/0095384 A1 | 5/2007 | Farquhar et al. |
| 2007/0253686 A1 | 11/2007 | Wendt et al. |
| 2007/0283996 A1 | 12/2007 | Hachtmann et al. |
| 2007/0283997 A1 | 12/2007 | Hachtmann et al. |
| 2008/0011350 A1 | 1/2008 | Luch |
| 2008/0023069 A1 | 1/2008 | Terada et al. |
| 2008/0053512 A1 | 3/2008 | Kawashima |
| 2008/0090022 A1 | 4/2008 | Ovshinsky |
| 2008/0099063 A1 | 5/2008 | Armstrong et al. |
| 2008/0121265 A1 | 5/2008 | Hishida et al. |
| 2008/0128013 A1 | 6/2008 | Lopatin et al. |
| 2008/0202577 A1 | 8/2008 | Hieslmair |
| 2008/0227236 A1 | 9/2008 | Luch |
| 2008/0257399 A1 | 10/2008 | Wong et al. |
| 2008/0314433 A1 | 12/2008 | Luch |
| 2009/0014058 A1 | 1/2009 | Croft et al. |
| 2009/0107538 A1 | 4/2009 | Luch |
| 2009/0111206 A1 | 4/2009 | Luch |
| 2009/0145551 A1 | 6/2009 | Luch |
| 2009/0169722 A1 | 7/2009 | Luch |
| 2009/0173374 A1 | 7/2009 | Luch |
| 2009/0178702 A1* | 7/2009 | Pichler .......... 136/244 |
| 2009/0223552 A1 | 9/2009 | Luch |
| 2009/0255469 A1 | 10/2009 | Britt et al. |
| 2009/0255565 A1 | 10/2009 | Britt et al. |
| 2009/0269877 A1 | 10/2009 | Pinarbasi et al. |
| 2009/0272436 A1 | 11/2009 | Cheung |
| 2009/0293941 A1 | 12/2009 | Luch |
| 2009/0314330 A1 | 12/2009 | Saha et al. |
| 2010/0108118 A1 | 5/2010 | Luch |
| 2010/0147356 A1 | 6/2010 | Britt |
| 2010/0193367 A1 | 8/2010 | Luch |
| 2010/0218824 A1 | 9/2010 | Luch |
| 2010/0224230 A1 | 9/2010 | Luch et al. |
| 2010/0229942 A1 | 9/2010 | Luch |
| 2010/0269902 A1 | 10/2010 | Luch et al. |
| 2010/0313946 A1 | 12/2010 | Higuchi et al. |
| 2011/0056537 A1 | 3/2011 | Luch |
| 2011/0067754 A1 | 3/2011 | Luch |
| 2011/0070678 A1 | 3/2011 | Luch |
| 2011/0086462 A1* | 4/2011 | Ovshinsky ............ 438/72 |
| 2011/0239450 A1* | 10/2011 | Basol et al. ............ 29/738 |
| 2012/0000502 A1 | 1/2012 | Wiedeman et al. |
| 2012/0000510 A1 | 1/2012 | Wiedeman et al. |
| 2012/0006378 A1 | 1/2012 | Kanto et al. |
| 2012/0171802 A1 | 7/2012 | Luch et al. |
| 2012/0322194 A1 | 12/2012 | Luch |
| 2013/0037074 A1 | 2/2013 | Britt et al. |
| 2013/0052769 A1 | 2/2013 | Luch |
| 2013/0240011 A1 | 9/2013 | Luch |
| 2013/0255744 A1 | 10/2013 | Luch |
| 2013/0255746 A1 | 10/2013 | Luch et al. |
| 2013/0255771 A1 | 10/2013 | Luch |
| 2013/0269748 A1 | 10/2013 | Wiedeman et al. |

FOREIGN PATENT DOCUMENTS

| | | |
|---|---|---|
| DE | 19814780 A1 | 7/1999 |
| DE | 212009000025 U1 | 10/2010 |

(56) References Cited

FOREIGN PATENT DOCUMENTS

| DE | 102009020482 A1 | 11/2010 |
|---|---|---|
| EP | 0111394 A2 | 6/1984 |
| JP | 51-110985 A | 9/1976 |
| WO | 2005077062 A2 | 8/2005 |
| WO | 2009006230 A2 | 1/2009 |
| WO | 2009097161 A1 | 8/2009 |
| WO | 2010039245 A1 | 4/2010 |
| WO | 2011090723 A2 | 7/2011 |
| WO | 2013158796 A1 | 10/2013 |

OTHER PUBLICATIONS

Nov. 29, 2011, Office action from the U.S. Patent and Trademark Office, in U.S. Appl. No. 12/364,440, which is another patent application of Global Solar Energy, Inc., 18 pages.

Aug. 28, 2012, Office action from the U.S. Patent and Trademark Office, in U.S. Appl. No. 12/587,111, which is another patent application of Global Solar Energy, Inc., 20 pages.

Dec. 6, 2012, Office action from the U.S. Patent and Trademark Office, in U.S. Appl. No. 12/980,201, which shares the same priority as this U.S. application, 20 pages.

Dec. 13, 2012, Office action from the U.S. Patent and Trademark Office, in U.S. Appl. No. 12/980,151, which shares the same priority as this U.S. application, 25 pages.

Jan. 9, 2013, Office action from the U.S. Patent and Trademark Office, in U.S. Appl. No. 12/976,911, which shares the same priority as this U.S. application, 23 pages.

Mar. 14, 2013, Office action from the U.S. Patent and Trademark Office, in U.S. Appl. No. 12/587,111, which is another patent application of Global Solar Energy, Inc., 21 pages.

Jul. 5, 2013, Office action from the U.S. Patent and Trademark Office, in U.S. Appl. No. 12/976,911, which shares the same priority as this U.S. application, 13 pages.

Jul. 15, 2013, Office action from the U.S. Patent and Trademark Office, in U.S. Appl. No. 12/980,201, which shares the same priority as this U.S. application, 25 pages.

Jul. 31, 2013, Office action from the U.S. Patent and Trademark Office, in U.S. Appl. No. 12/980,151, which shares the same priority as this U.S. application, 19 pages.

Dec. 24, 2013, Office action from the U.S. Patent and Trademark Office, in U.S. Appl. No. 13/482,699, which is another patent application of Global Solar Energy, Inc., 31 pages.

Sep. 15, 2014, Extended European Search Report from The European Patent Office, in European Patent Application No. 10844268.2, which is another application of Applicant Hanergy Hi-Tech Power (HK) Limited.

May 14, 2014, International Search Report of the International Search Authority from The U.S. Receiving Office, in PCT/US2014/013348, which is an international application of Applicant Hanergy Hi-Tech Power (HK) Limited.

May 14, 2014, Written Opinion of the International Search Authority from The U.S. Receiving Office, in PCT/US2014/013348, which is an international application of Applicant Hanergy Hi-Tech Power (HK) Limited.

Oct. 30, 2014, International Preliminary Report on Patentability from The International Bureau of WIPO, in PCT/US2013/037024, which is an international patent application of Hanergy Hi-Tech Power (HK) Limited.

\* cited by examiner

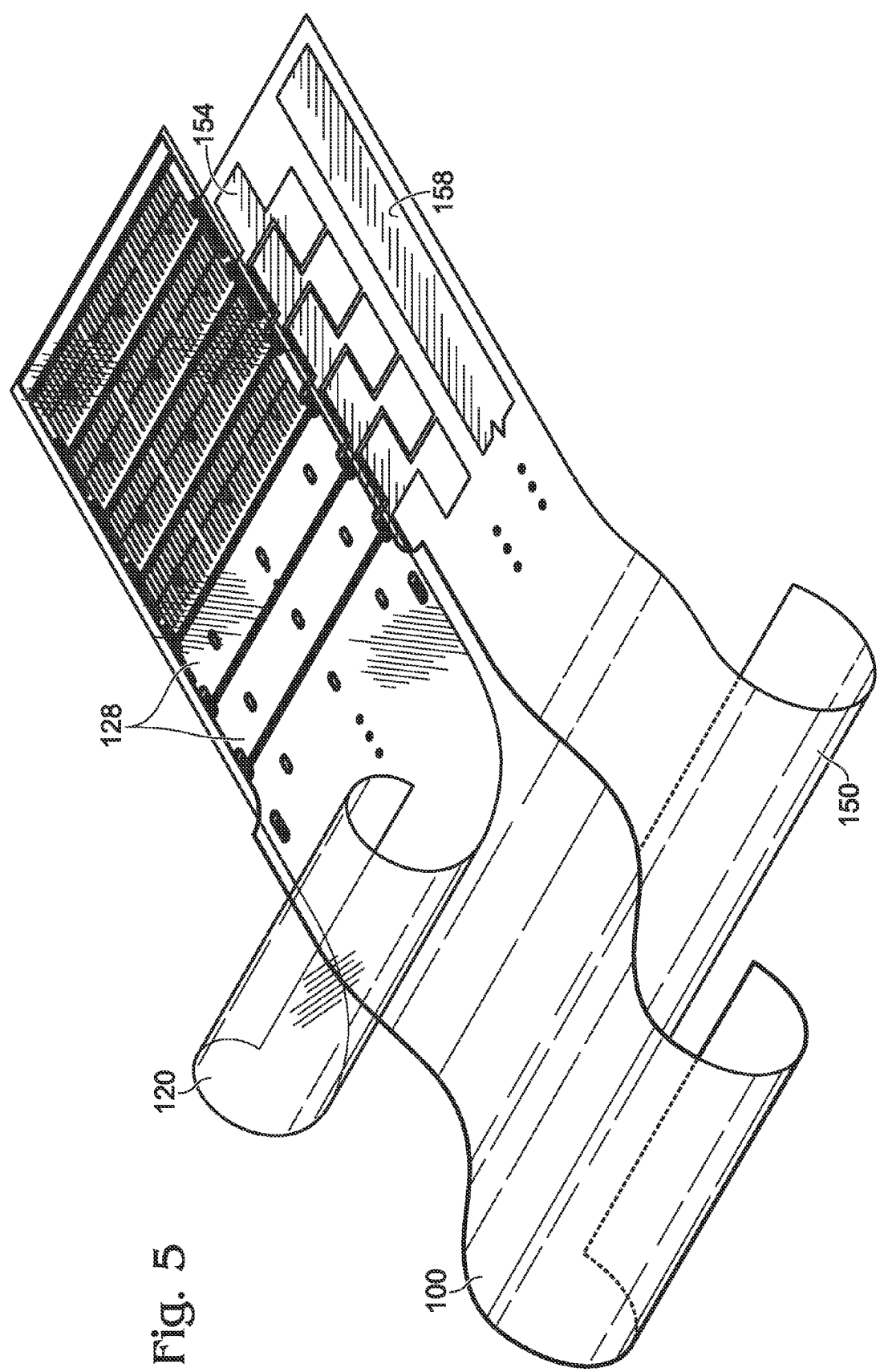

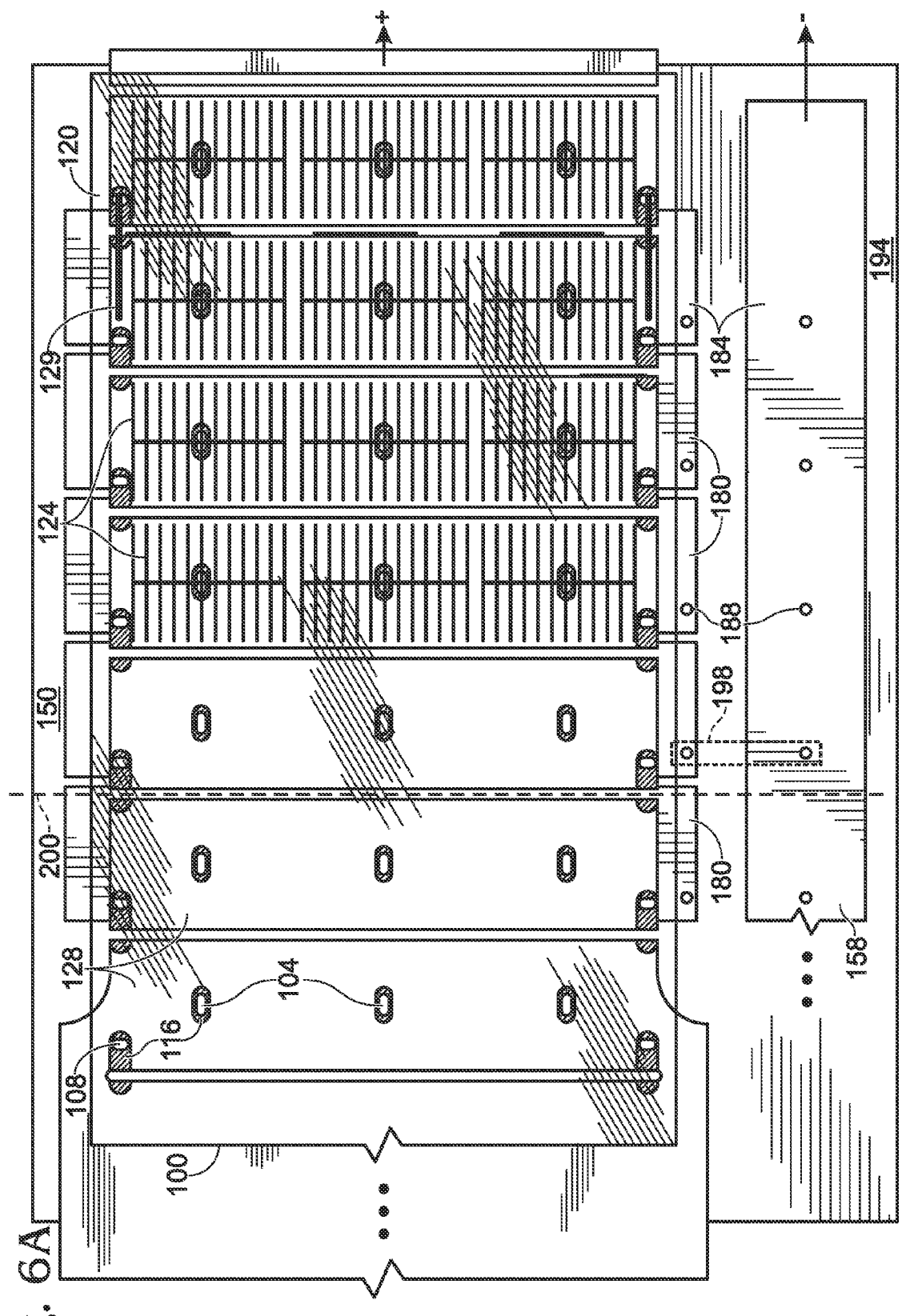

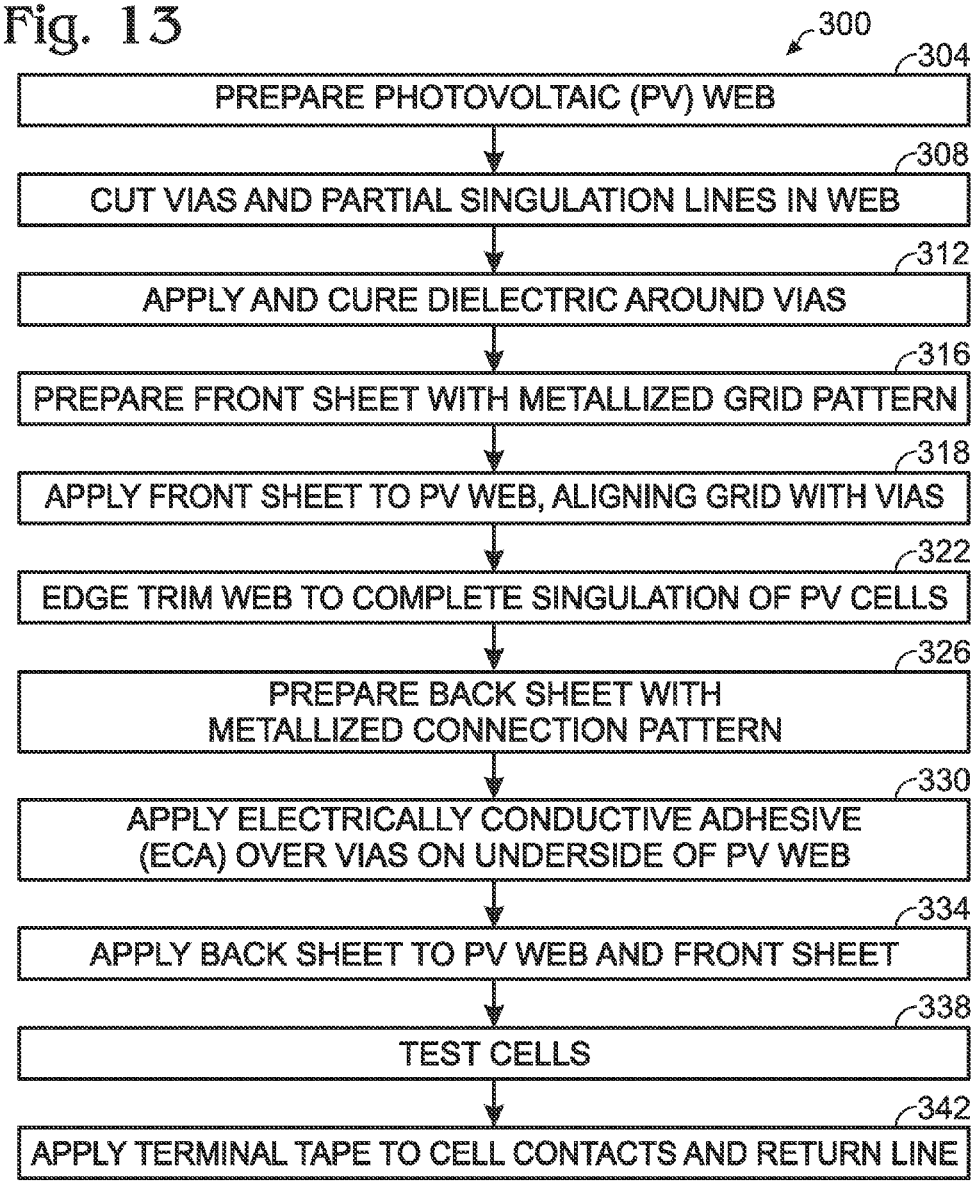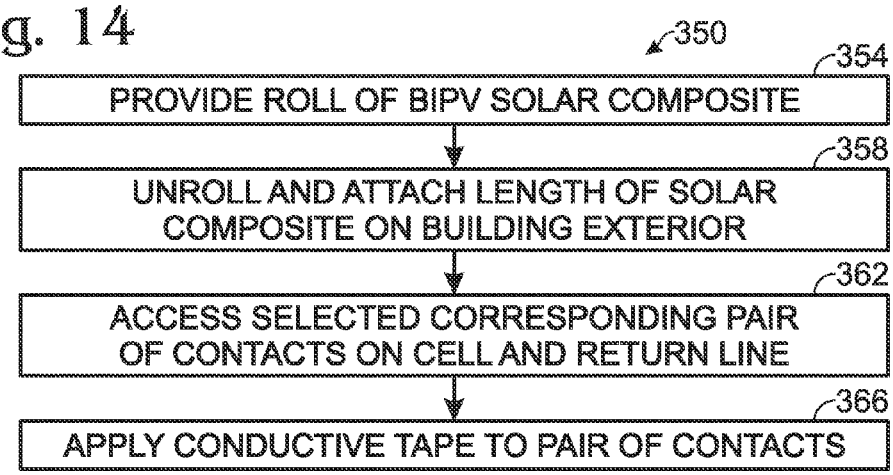

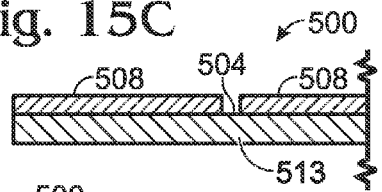
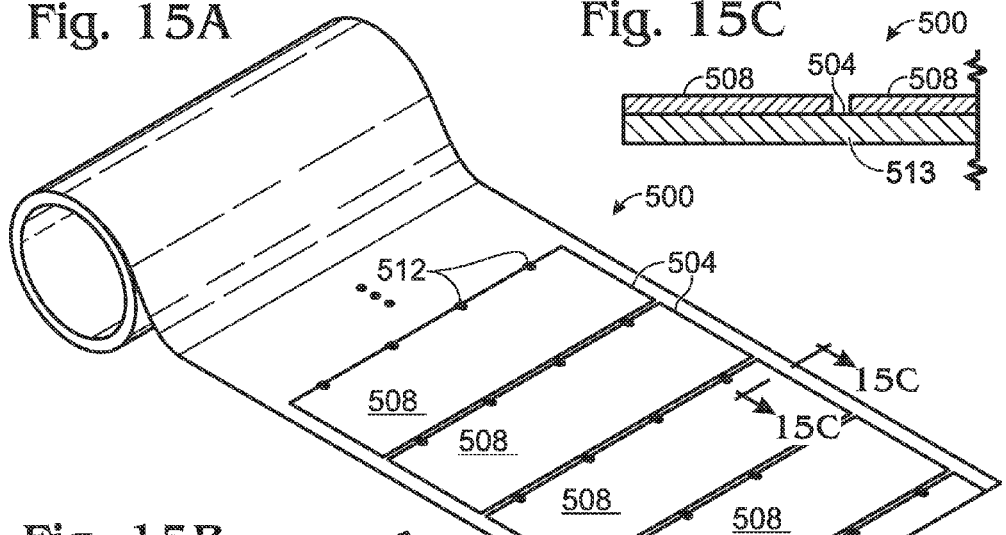
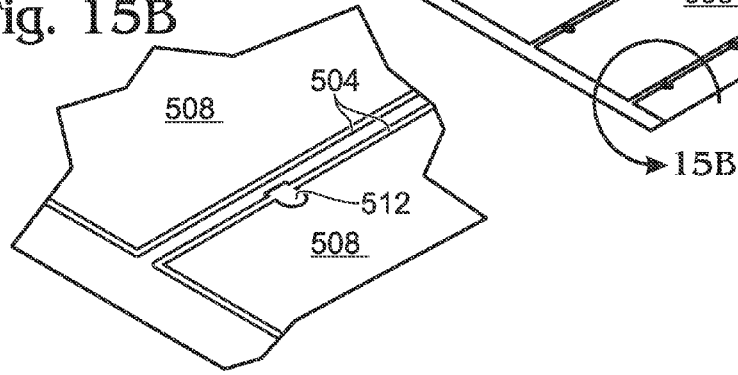
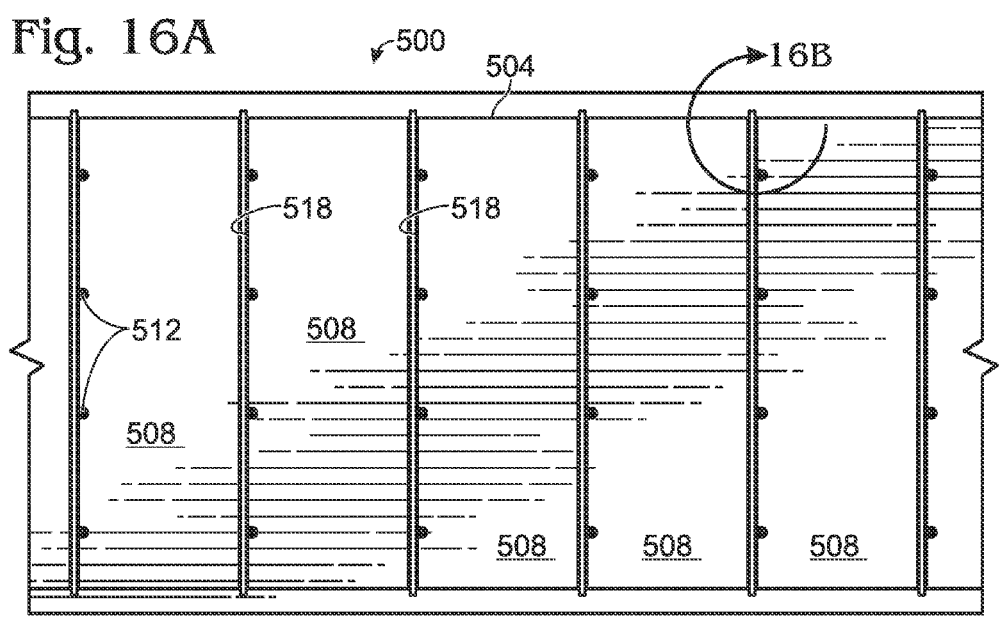

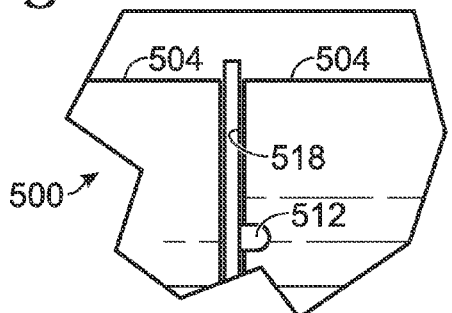
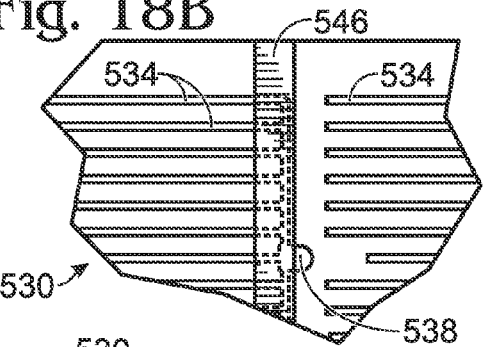
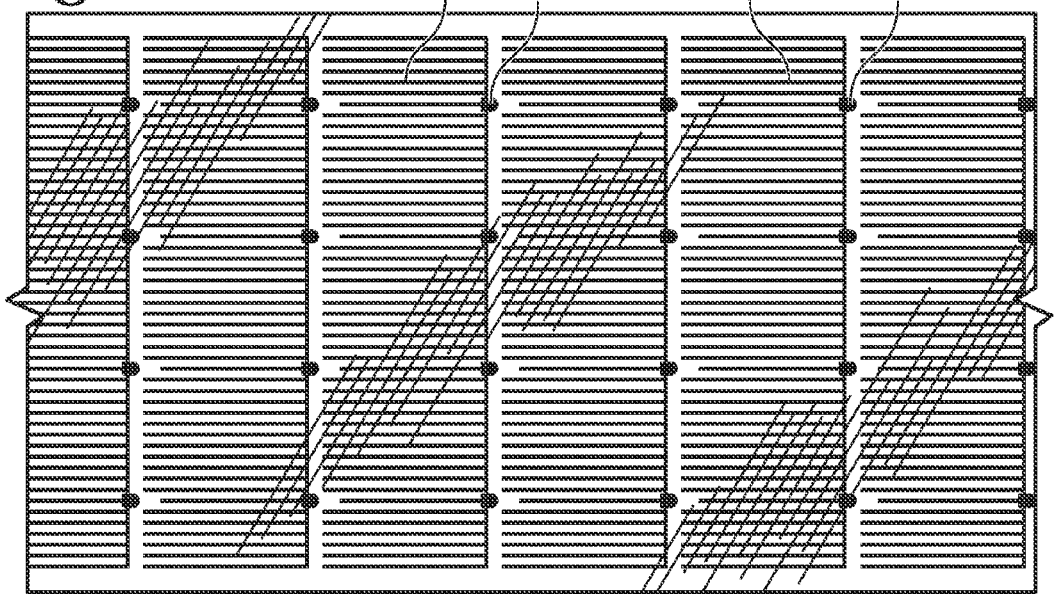
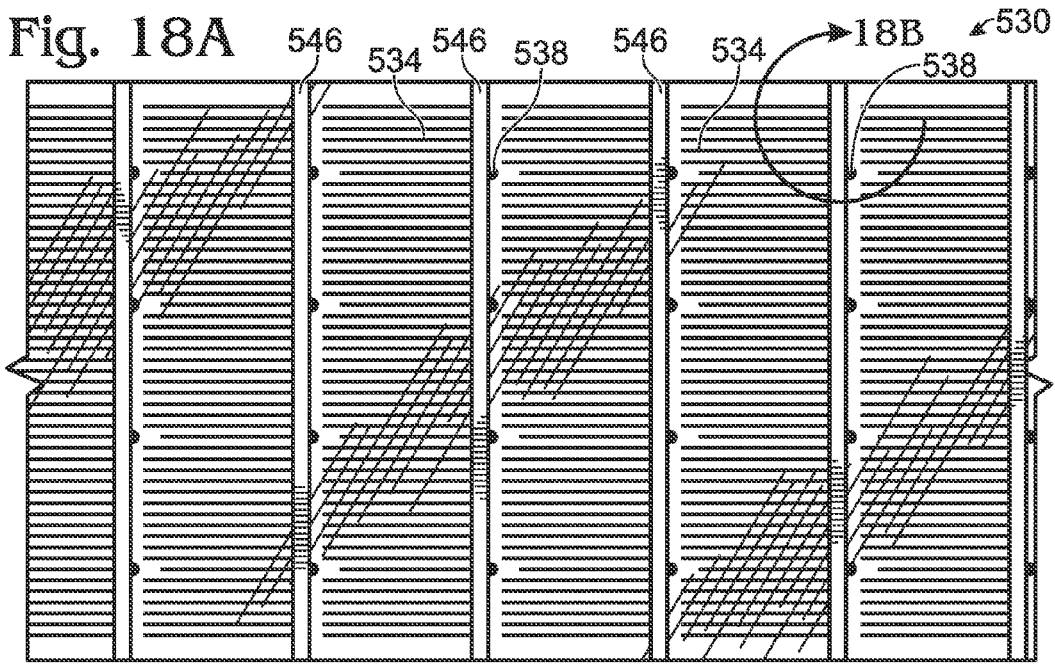

INTEGRATED THIN FILM SOLAR CELL INTERCONNECTION

CROSS-REFERENCE TO RELATED APPLICATIONS

This application is a continuation of U.S. patent application Ser. No. 12/980,201, filed Dec. 28, 2010, which claims priority from U.S. Provisional Patent Application Ser. No. 61/284,924, filed Dec. 28, 2009; Ser. No. 61/284,956, filed Dec. 28, 2009; and Ser. No. 61/284,958, filed Dec. 28, 2009, all of which are incorporated herein by reference. Also incorporated by reference in their entireties are the following patents and patent applications: U.S. Pat. No. 7,194,197; U.S. Pat. No. 6,690,041; Ser. No. 12/364,440, filed Feb. 2, 2009; Ser. No. 12/424,497, filed Apr. 15, 2009; and Ser. No. 12/587,111, filed Sep. 30, 2009.

BACKGROUND

The field of photovoltaics generally relates to multi-layer materials that convert sunlight directly into DC electrical power. The basic mechanism for this conversion is the photovoltaic effect, first observed by Antoine-Cesar Becquerel in 1839, and first correctly described by Einstein in a seminal 1905 scientific paper for which he was awarded a Nobel Prize for physics. In the United States, photovoltaic (PV) devices are popularly known as solar cells or PV cells. Solar cells are typically configured as a cooperating sandwich of p-type and n-type semiconductors, in which the n-type semiconductor material (on one "side" of the sandwich) exhibits an excess of electrons, and the p-type semiconductor material (on the other "side" of the sandwich) exhibits an excess of holes, each of which signifies the absence of an electron. Near the p-n junction between the two materials, valence electrons from the n-type layer move into neighboring holes in the p-type layer, creating a small electrical imbalance inside the solar cell. This results in an electric field in the vicinity of the metallurgical junction that forms the electronic p-n junction.

When an incident photon excites an electron in the cell into the conduction band, the excited electron becomes unbound from the atoms of the semiconductor, creating a free electron/hole pair. Because, as described above, the p-n junction creates an electric field in the vicinity of the junction, electron/hole pairs created in this manner near the junction tend to separate and move away from junction, with the electron moving toward the electrode on the n-type side, and the hole moving toward the electrode on the p-type side of the junction. This creates an overall charge imbalance in the cell, so that if an external conductive path is provided between the two sides of the cell, electrons will move from the n-type side back to the p-type side along the external path, creating an electric current. In practice, electrons may be collected from at or near the surface of the n-type side by a conducting grid that covers a portion of the surface, while still allowing sufficient access into the cell by incident photons.

Such a photovoltaic structure, when appropriately located electrical contacts are included and the cell (or a series of cells) is incorporated into a closed electrical circuit, forms a working PV device. As a standalone device, a single conventional solar cell is not sufficient to power most applications. As a result, solar cells are commonly arranged into PV modules, or "strings," by connecting the front of one cell to the back of another, thereby adding the voltages of the individual cells together in electrical series. Typically, a significant number of cells are connected in series to achieve a usable voltage. The resulting DC current then may be fed through an inverter, where it is transformed into AC current at an appropriate frequency, which is chosen to match the frequency of AC current supplied by a conventional power grid. In the United States, this frequency is 60 Hertz (Hz), and most other countries provide AC power at either 50 Hz or 60 Hz.

One particular type of solar cell that has been developed for commercial use is a "thin-film" PV cell. In comparison to other types of PV cells, such as crystalline silicon PV cells, thin-film PV cells require less light-absorbing semiconductor material to create a working cell, and thus can reduce processing costs. Thin-film based PV cells also offer reduced cost by employing previously developed deposition techniques for the electrode layers, where similar materials are widely used in the thin-film industries for protective, decorative, and functional coatings. Common examples of low cost commercial thin-film products include water impermeable coatings on polymer-based food packaging, decorative coatings on architectural glass, low emissivity thermal control coatings on residential and commercial glass, and scratch and anti-reflective coatings on eyewear. Adopting or modifying techniques that have been developed in these other fields has allowed a reduction in development costs for PV cell thin-film deposition techniques.

Furthermore, thin-film cells have exhibited efficiencies approaching 20%, which rivals or exceeds the efficiencies of the most efficient crystalline cells. In particular, the semiconductor material copper indium gallium diselenide (CIGS) is stable, has low toxicity, and is truly a thin film, requiring a thickness of less than two microns in a working PV cell. As a result, to date CIGS appears to have demonstrated the greatest potential for high performance, low cost thin-film PV products, and thus for penetrating bulk power generation markets. Other semiconductor variants for thin-film PV technology include copper indium diselenide, copper indium disulfide, copper indium aluminum diselenide, and cadmium telluride.

Some thin-film PV materials may be deposited either on rigid glass substrates, or on flexible substrates. Glass substrates are relatively inexpensive, generally have a coefficient of thermal expansion that is a relatively close match with the CIGS or other absorber layers, and allow for the use of vacuum deposition systems. However, when comparing technology options applicable during the deposition process, rigid substrates suffer from various shortcomings during processing, such as a need for substantial floor space for processing equipment and material storage, expensive and specialized equipment for heating glass uniformly to elevated temperatures at or near the glass annealing temperature, a high potential for substrate fracture with resultant yield loss, and higher heat capacity with resultant higher electricity cost for heating the glass. Furthermore, rigid substrates require increased shipping costs due to the weight and fragile nature of the glass. As a result, the use of glass substrates for the deposition of thin films may not be the best choice for low-cost, large-volume, high-yield, commercial manufacturing of multi-layer functional thin-film materials such as photovoltaics.

In contrast, roll-to-roll processing of thin flexible substrates allows for the use of compact, less expensive vacuum systems, and of non-specialized equipment that already has been developed for other thin film industries. PV cells based on thin flexible substrate materials also exhibit a relatively high tolerance to rapid heating and cooling and to large thermal gradients (resulting in a low likelihood of fracture or failure during processing), require comparatively low shipping costs, and exhibit a greater ease of installation than cells based on rigid substrates. Additional details relating to the composition and manufacture of thin film PV cells of a type suitable for use with the presently disclosed methods and apparatus may be found, for example, in U.S. Pat. Nos. 6,310, 281, 6,372,538, and 7,194,197, all to Wendt et al. These patents are hereby incorporated into the present disclosure by reference for all purposes.

As noted previously, a significant number of PV cells often are connected in series to achieve a usable voltage, and thus a desired power output. Such a configuration is often called a "string" of PV cells. Due to the different properties of crystalline substrates and flexible thin film substrates, the electrical series connection between cells may be constructed differently for a thin film cell than for a crystalline cell, and forming reliable series connections between thin film cells poses several challenges. For example, soldering (the traditional technique used to connect crystalline solar cells) directly on thin film cells exposes the PV coatings of the cells to damaging temperatures, and the organic-based silver inks typically used to form a collection grid on thin film cells may not allow strong adherence by ordinary solder materials in any case. Thus, PV cells often are joined with wires or conductive tabs attached to the cells with an electrically conductive adhesive (ECA), rather than by soldering.

However, even when wires or tabs are used to form intercell connections, the extremely thin coatings and potential flaking along cut PV cell edges introduces opportunities for shorting (power loss) wherever a wire or tab crosses over a cell edge. Furthermore, the conductive substrate on which the PV coatings are deposited, which typically is a metal foil, may be easily deformed by thermo-mechanical stress from attached wires and tabs. This stress can be transferred to weakly-adhering interfaces, which can result in delamination of the cells. In addition, adhesion between the ECA and the cell back side, or between the ECA and the conductive grid on the front side, can be weak, and mechanical stress may cause separation of the wires or tabs at these locations. Also, corrosion can occur between the molybdenum or other coating on the back side of a cell and the ECA that joins the tab to the solar cell there. This corrosion may result in a high-resistance contact or adhesion failure, leading to power losses.

Advanced methods of joining thin film PV cells with conductive tabs or ribbons may largely overcome the problems of electrical shorting and delamination, but may require undesirably high production costs to do so. Furthermore, all such methods—no matter how robust—require that at least some portion of the PV string be covered by a conductive tab, which blocks solar radiation from striking that portion of the string and thus reduces the efficiency of the system. As a result, there is a need for improved methods of interconnecting PV cells into strings, and for improved strings of interconnected cells. Specifically, there is a need for strings and methods of their formation that reduce interconnection costs and reduce the fraction of each PV cell that is covered by the interconnection mechanism, while maintaining or improving the ability of the cell to withstand stress.

SUMMARY

Photovoltaic module configurations include multiple flexible thin film photovoltaic cells electrically connected in series, and laminated to a substantially transparent top sheet having a conductive grid pattern facing the cells. Modules may also have a back sheet for protection. The back sheet may also have a conductive pattern which is connected at selected locations to the top sheet grid establishing electrical interconnection between opposite sides of adjacent cells.

Methods of manufacturing photovoltaic modules including integrated multi-cell interconnections are also described. Methods include steps of coordinating, integrating, and registering multiple rolls of substrates in a continuous process. A photovoltaic web material may be cut to provide partially singulated cell regions. Singulation of discrete cells may later be carried out by trimming edge portions after the web has been laminated to another continuous sheet of material.

Methods of producing a building integrated photovoltaic (BIPV) product, and methods of installing a BIPV product are also described. A BIPV product including a laminated module package containing plural interconnected photovoltaic cells may be provided in roll form. The laminated module may also have a conductive return line parallel to the string of cells. The module may be configured to allow an installer to cut an appropriate strip from the roll for a specific building feature, for example, a stretch of roof. The installer may then apply an electrical connection from the last cell in the string, to the return line, providing positive and negative connection contacts on the same end, side, or proximity of the module.

Numerous other devices, intermediate articles, methods of manufacture, and methods of BIPV installation will be apparent from the detailed description below and related figures.

BRIEF DESCRIPTION OF THE FIGURES

FIG. 5 is a perspective view showing the composite assembly of FIG. 3 in the process of being laminated onto the back sheet of FIG. 4 in a continuous roll-to-roll process.

FIG. 6A is a top plan view of the component shown in FIG. 5, after assembly and lamination.

FIG. 13 is a flow chart illustrating a method of manufacturing a flexible photovoltaic module for installation on an exterior surface of a building.

FIG. 14 is a flow chart illustrating a method of installing a building integrated photovoltaic (BIPV) product on a building.

FIG. 15A is a perspective view of a photovoltaic web, in roll form, with scribe cuts defining discreet cells for eventual assembly into interconnected sets of cells in another example of a photovoltaic module.

FIG. 15B is a magnified perspective view of a portion of the web shown in FIG. 15A.

FIG. 15C is a cross-sectional view of a portion of the web shown in FIG. 15A.

FIG. 16A is a top plan view of the photovoltaic web of FIG. 15A, with the addition of cuts between discreet cell areas to provide partial singulation of the cells.

FIG. 16B is a magnified plan view of a portion of the web shown in FIG. 16A.

FIG. 17 is a top plan view of a transparent front sheet including a conductive grid pattern for mounting on top of the cells defined in FIGS. 15A and 16A.

FIG. 18A is a top plan view of the transparent front sheet shown in FIG. 17, with the addition of dielectric strips applied over portions of the conductive grid.

FIG. 18B is a magnified plan view of a portion of the front sheet shown in FIG. 18A.

DETAILED DESCRIPTION

Systems and methods of interconnecting thin-film photovoltaic cells in a flexible substrate package may include a series of photovoltaic cells and a transparent top sheet covering the cells. Electrically-conductive pathways are established connecting a "sunny" side of one cell to the back side of an adjacent cell. One or more holes or "vias" may be provided in a given cell for providing an electrical connection from a conductive grid on the top side of a cell to a back side of an adjacent cell. Additional methods and apparatus for interconnecting flexible, thin-film photovoltaic (PV) cells in a scalable, efficient process, are provided. More specifically, examples of the present teachings relate to a roll-to-roll assembly of flexible PV cells on a flexible current-carrying back sheet. The back sheet may be a conductive substrate on which photovoltaic materials have been deposited. Alternatively a current carrying back sheet may include an insulating substrate having a conductive grid pattern deposited on one side. The resulting assembly may be particularly well suited for building integrated photovoltaic (BIPV) applications, such as installation onto the roof or side of a building. A current-carrying back sheet may include a metalized pattern that provides one or more of the following features, among others: (1) facilitating PV cell interconnection, (2) providing a "return line" to transfer power produced by a module of interconnected cells to a desired location, (3) providing a test area allowing PV cells to be tested prior to final installation, and/or (4) providing an attachment area to simplify installation of a module, for example, on a roof or other exterior surface of a building.

Figure 1:
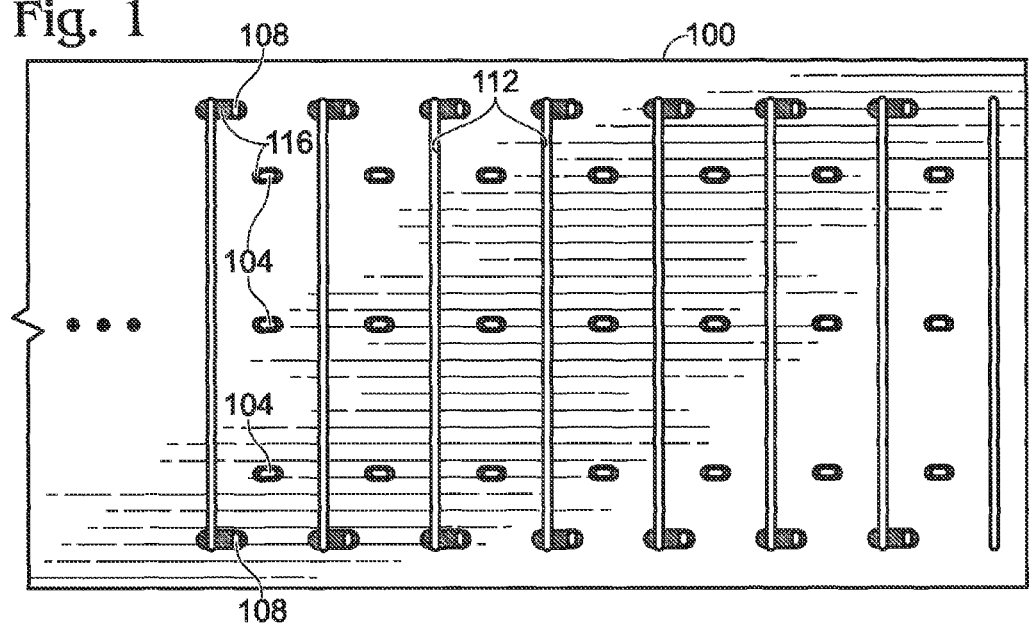
FIG. 1 is a top plan view of a continuous web of thin-film photovoltaic material including slits and vias being prepared for assembly into an interconnected photovoltaic module.

FIG. 1 shows an intermediate article of manufacture used in a continuous in-line process to produce photovoltaic modules including a plurality of photovoltaic cells integrally interconnected in series. Web 100 is a thin-film flexible continuous expanse of photovoltaic material made, for example, according to principles explained in detail in U.S. Pat. No. 7,194,197 which is hereby incorporated by reference. In a preliminary step of the process, a laser may be used to make cuts in web 100 including a plurality of holes or "vias" 104, edge apertures 108 and partial singulation slits 112. The purposes of the initial cuts shown in FIG. 1, will become more apparent below with further description of the subsequent processing steps.

After cutting holes as shown in FIG. 1, dielectric material 108 is applied and cured around the vias 104 and edge apertures. Suitable dielectric materials for application around the vias may be any insulating material that is easy to apply and cure in a roll-to-roll process, without harming the surrounding photovoltaic material.

Figure 2:
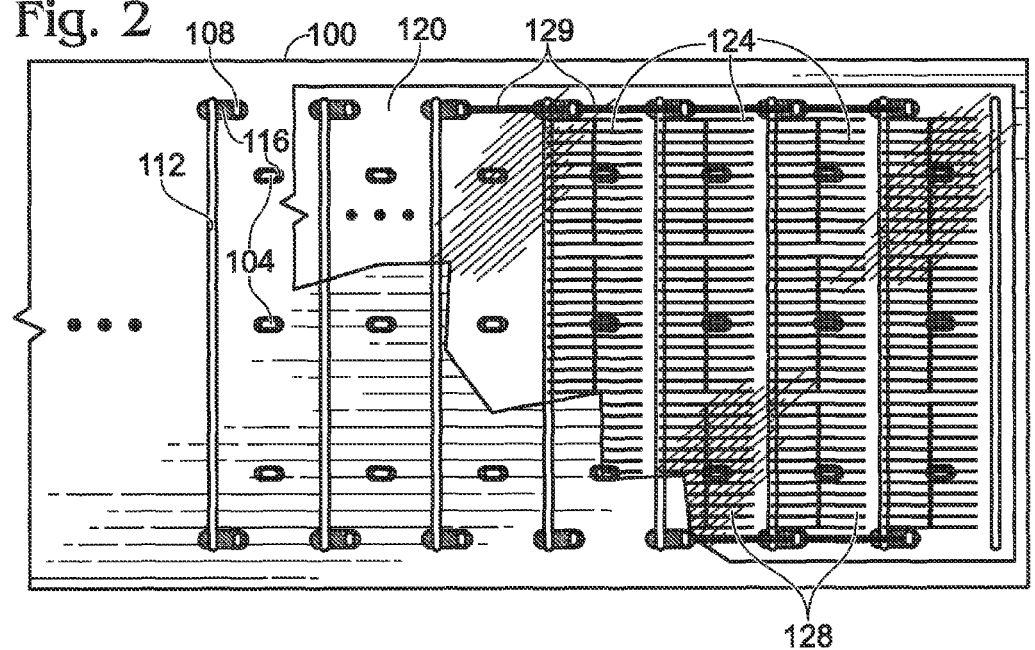
FIG. 2 is a top plan view of the photovoltaic web shown in FIG. 1, with the addition of a front sheet including a metalized pattern registered over the photovoltaic material.

Independently from preparation of web 100 as shown in FIG. 1, transparent front sheet 120 as shown in FIG. 2, receives conductive grid pattern 124. In a preferred embodiment, the conductive grid is applied onto a thermoplastic layer. For example, a thermoplastic layer may include an ionomer which may be obtained from E.I. du Pont de Nemours and Company, commonly referred to as DuPont, under the trade name Surlyn. The front sheet is a clear sheet of starting substrate, for example (PET), having a thickness of approximately 50-microns. The PET receives an even extrusion coating of the ionomer everywhere on one side, for example, about 100-microns in thickness. Next, a layer of copper foil having a thickness of about 20-microns is applied to the ionomer layer. The grid pattern on the front sheet may be defined using an "etch resist" pattern, and then the copper in all other areas is removed (chemically etched away). After the etch step, the PET and ionomer layers remain with copper remaining only in areas where it is desired to form the conductive grid or conducting traces for a reverse diode structure, to be described in more detail below. The ionomer material remains exposed everywhere where the copper has been removed, i.e., around the grid structure.

As shown in FIG. 2, front sheet 120 includes grid structure 124 and conductive traces 129. Front sheet 120 is applied to web 100 with grid 124 subcomponents aligned over partially singulated cell regions 128. Front sheet 120 is then "tacked" into place on web 100 by, for example, using direct heat from laser diodes, a laser, or hot air jets, which are directed at a small number of spots (small areas, for example, 1- to 2-cm in diameter, to melt ionomer on the front sheet or back sheet) as the photovoltaic passes through a final pair of "nip" rollers in the in-line process. The heat melts the ionomer in a few small spots over each partially singulated cell, and the nip rolls press the front sheet and the photovoltaic layers together causing them to stick together in a few small spots, which is enough to hold the assembly together as it is rolled up. In a subsequent step later in the process, the entire composite goes through final lamination where it is re-melted, causing it to stick together everywhere.

Figure 3:
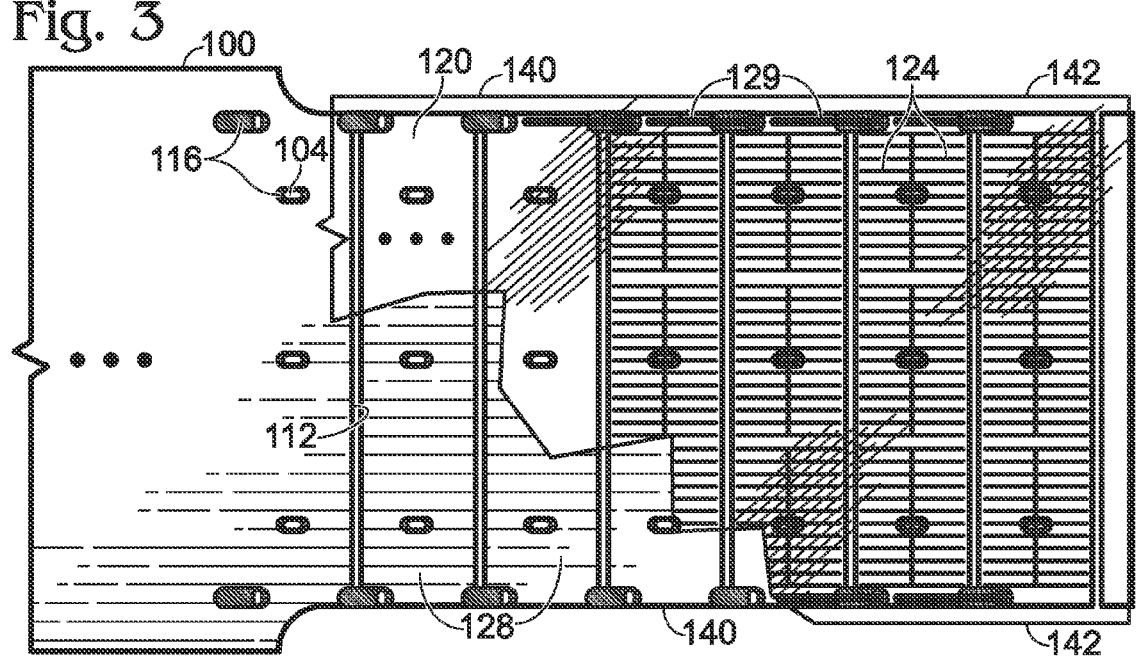
FIG. 3 is a top plan view of the same assembly shown in FIG. 2, after an additional step of trimming the edge regions of the web to complete singulation of individual cells.

FIG. 3 shows a subsequent process step in which the multi-sheet composite of FIG. 2 is cut along edges 140. The side cuts 140 along with prior cuts 112 in web 100 complete singulation (complete separation of individual photovoltaic cells 128). The edge cuts shown in FIG. 3 may be made by a laser to selectively trim the edges of the photovoltaic material while leaving overlapping end portions 142 of front sheet 120. Overlapping edge regions 142 then are available to be laminated to a back sheet, as described in a subsequent step below.

Figure 4:
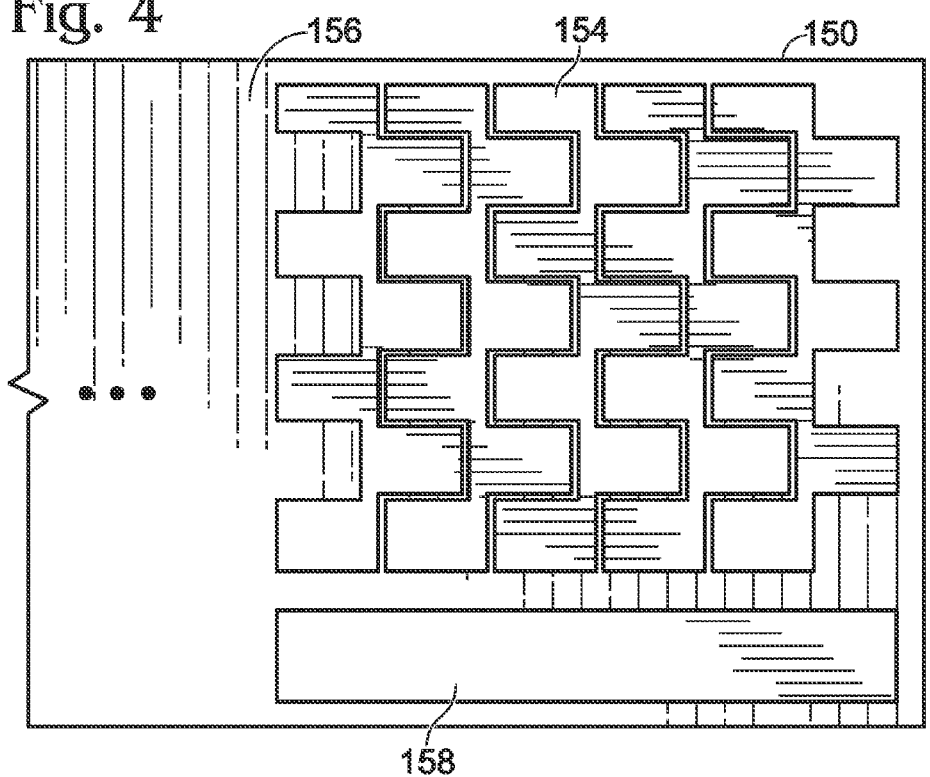
FIG. 4 is a top plan view of a back sheet for a photovoltaic module, including a metalized pattern for conducting electricity from one cell to an adjacent cell.

FIG. 4 shows back sheet 150 which has been prepared for lamination with the composite shown in FIG. 3 in a roll-to-roll process. Back sheet 150 may be made from a flexible substrate material. For example, suitable substrates may be constructed from PET, PEN, PEEK, polyimide, ETFE, among others. In a preferred method, an "etch resist" process is used to pattern upper layer 154 on back sheet 150. Conductive pattern 154 may be made of copper or silver, among other materials. In a preferred embodiment, back sheet 150 has a layer of thermoplastic material 156, for example, an ionomer as discussed above. The substrate material may be, for example, PET at a thickness of about 50-microns. An extruded coating of ionomer is applied across the surface at a thickness of about 100-microns. A copper foil is then applied over the ionomer. The copper foil layer may be about 25-microns thick. The copper layer is then patterned with an "etch resist" material at a flex circuit manufacturer, and then the copper in all other areas is removed chemically, i.e., etched away using a process similar to those used to make printed circuit boards. What remains is the PET and ionomer layers everywhere with copper remaining only in the areas where its needed to form back sheet conductive grid 154 and return line 158. Back sheet 150 is then printed with an insulating layer (dielectric) everywhere except where contacts (shown in subsequent drawings) will be made through vias or to the back side of a cell.

FIG. 5 shows front sheet 120 laminated on top of photovoltaic web and/or discreet cells 128, and back sheet 150 being thermoplastically adhered to the bottom side of web 100. Prior to assembly, however, electrically conductive adhesive (ECA) is applied over the vias on the underside of photovoltaic web 100. The purpose of the ECA adhesive is to connect the grid on the top side of cells 128 to back sheet grid 154. For example, a suitable ECA for this purpose may be obtained from Engineered Conductive Materials under the name DB1541-5. Similar suitable products may be obtained from Conductive Materials, Inc., E. I. du Pont de Nemours and Company, and Henkel AG & Co. KGaA.

FIG. 6A shows a plan view of a partially manufactured photovoltaic module. As explained previously, back sheet 150 and front sheet 120 have been laminated together sandwiching singulated photovoltaic cells 128. Electrically conductive adhesive (ECA) has been placed in vias 104 to provide electrical interconnection from grids 124 on the top side of photovoltaic cells 128 with grid 154 on back sheet 150. Test areas 180 are provided at the end of each cell. Test areas 180 are formed by a portion of each cell which extends beyond its respective grid 124. Test areas 180 provide easy access to each cell for testing electrical efficiency and performance during or at the end of the manufacturing process.

In a final stage of assembling the photovoltaic module into a packaged product configuration, for example, a building integrated photovoltaic (BIPV) product, terminal tape 184 which is selected to be nonconducting and protective, is placed over return line 158 and over exposed contacts or test areas 180. It may also be desirable to create partially cut out regions 188 on return line 158 and test areas 180.

An entire module including the portion shown in FIG. 6A may take the form of a continuous photovoltaic product in a roll form. A product example is configured for installation on a roof. An installer may unroll a line of BIPV roofing material, substantially as shown in FIG. 6A. Nailing area 194 is provided near an edge for attaching the material to the exterior of a building by nailing, stapling, tacking, or some other appropriate attachment mechanism. Once the installer has unrolled an appropriate dimension of the flexible photovoltaic composite substrate, terminal tape may be removed from die cut holes 188 over a pair of corresponding holes over a selected terminal contact of a particular cell and a corresponding hole on return line 158. Conductive tape, or some other appropriate conductive connector, 198 may then be applied to electrically connect the selected cell contact to return line 158. The photovoltaic composite substrate may then be cut along line 200. Return line 158 leads to a terminal approximately near or along the same end of the module where an opposite terminal is connected to the other end of the string of cells. Providing positive and negative contacts for the module near the same side or end of the module product simplifies the installation layout and process.

Figure 6B:
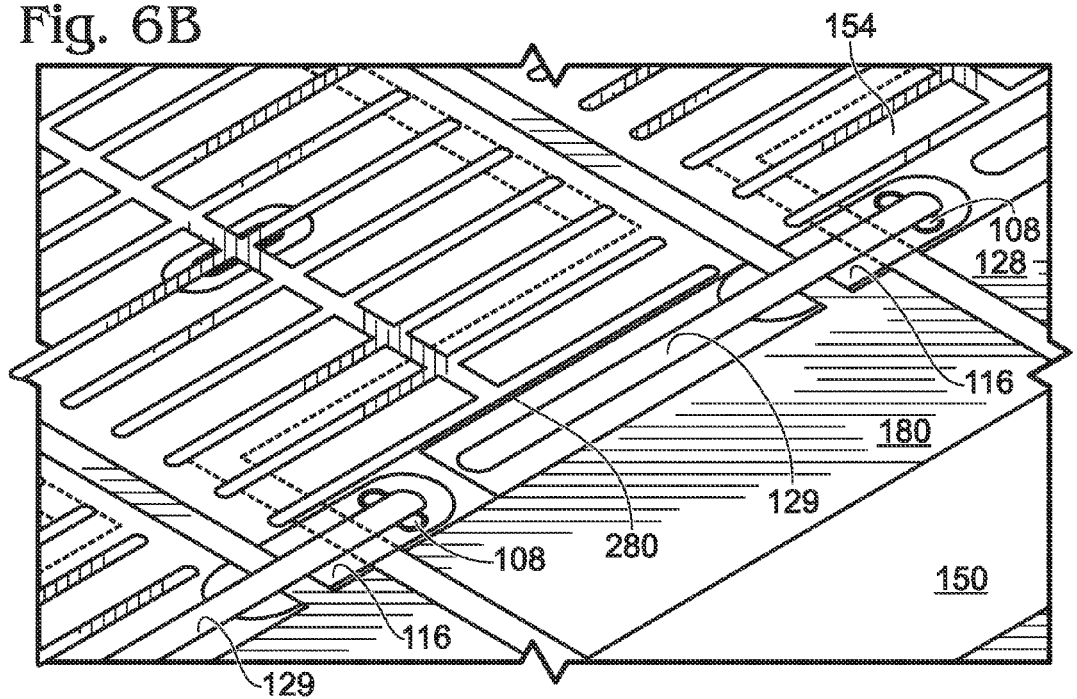
FIG. 6B is a magnified perspective view of a portion of the substrate composition shown in FIG. 6A, focusing on a bypass diode component of a photovoltaic module.

FIGS. 2, 3 and 6A also show integrated bypass diode structures for allowing current to pass backwards from a cell that is shaded from light while the rest of the cells are operating, thereby preventing damage to the shaded cell, and allowing the power from the unshaded cells to leave the module. The concept of using integrated diodes in thin-film photovoltaic devices is described in detail in U.S. Pat. No. 6,690,041 which is hereby incorporated by reference in its entirety for all purposes. FIG. 6B shows close up details of an integrated bypass diode for use in photovoltaic modules. FIG. 6B shows cells 128 including exposed contact regions 180. Vias 108 contain ECA for making contact to grid 154, shown in dashed lines, on back sheet 150. Dielectric 116 is applied encompassing via 108 and extending in an oblong shape covering edges of adjacent cells. Rectangular scribe cut 280 penetrates through the photovoltaic layers, but not through the metal foil substrate. The scribed area defines a small rectangle of photovoltaic material at the edge of each cell that forms a "bypass diode". In general, the bypass concept uses a small rectangular area of the photovoltaic material near the cell edge, separated from the rest of the cell by a laser scribe, to form the bypass diode. The bypass diode allows current to pass backwards through any cell that is shaded from light while the rest of the cells are operating, preventing damage to the shaded cell, and allowing power from the unshaded cells to leave the module. Conductive trace 129, as described previously, is printed on the top sheet, and applied to the top of the photovoltaic web, for conducting current from via 108 of one cell to the top side of an adjacent cell.

Figure 7:
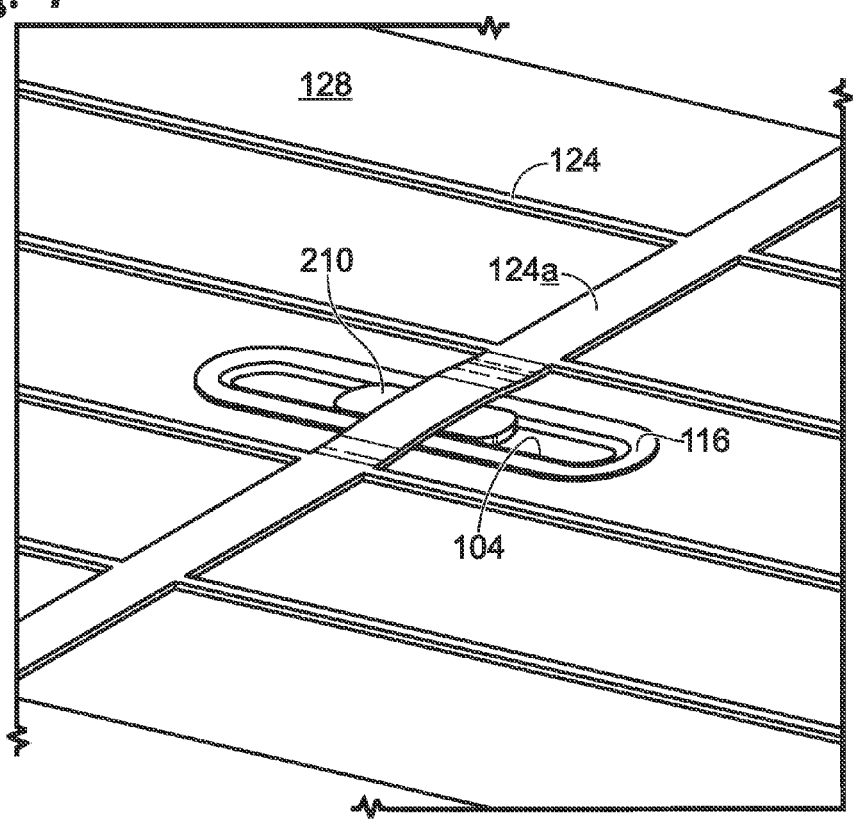
FIG. 7 is a magnified perspective view of a via as shown in FIG. 6A.

FIG. 7 shows a close up perspective view of via 104 circumscribed by dielectric material 116 in photovoltaic cell 128. Conductive grid 124 includes bus bar 124a which passes over and contacts ECA 210 in via 104. The oblong shape of via 104 provides registration tolerance for placement of bus bar 124a on top of ECA 210.

Figure 8:
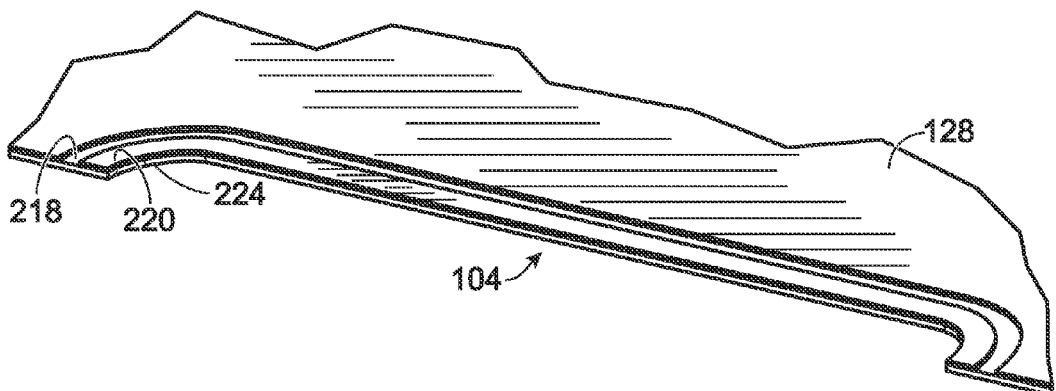
FIG. 8 is a partial perspective, sectional view of a via prior to applying dielectric material around the via.
Figure 9:
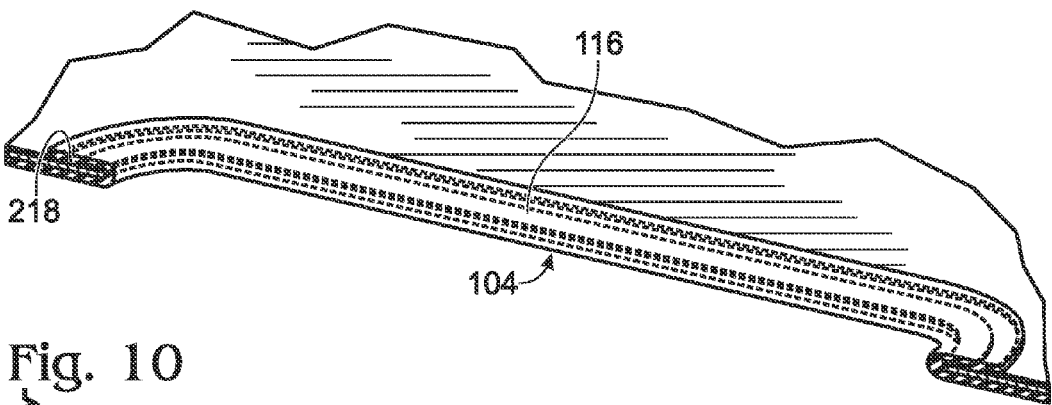
FIG. 9 is a partial perspective, sectional view of the via shown in FIG. 8 with the addition of dielectric material applied around the perimeter of the via.

FIG. 8 shows a cross-sectional view through via 104. Recess 218 is laser scribed around via 104 to isolate the shunted edges of the via aperture. Recess 218 cuts through PV layer 220, but not through back contact layer 224. FIG. 9 shows partial via 104 with dielectric material applied around the circumference of via 104 including in recess 218.

Figure 10:
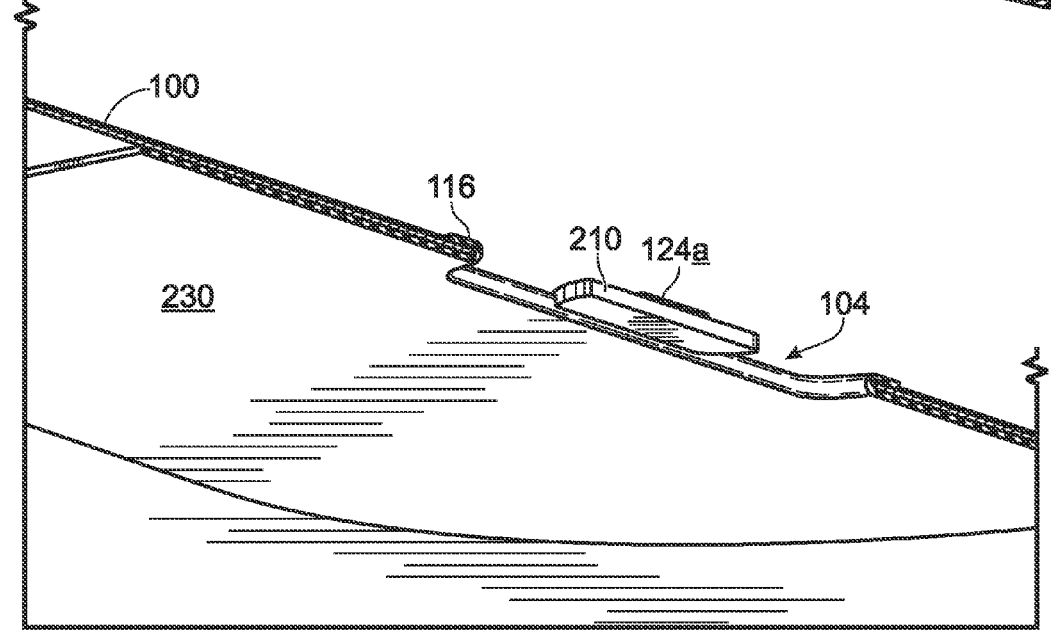
FIG. 10 is a bottom perspective, sectional view of the via shown in FIGS. 8 and 9.

FIG. 10 shows a partial view of via 104 from the underside of web 100. Bus bar 124a of grid 124 may be seen on top of ECA conductor 210 which electrically connects bus bar 124a to grid 154 on back sheet 150. Dielectric layer 230 is applied on the back side of web 100 around via 104 in a large enough area to prevent shorting between grid 154 on back sheet 150 and the back contact layer of cell 128, i.e., the same cell including via 104 and ECA conductor 210.

Figure 11:
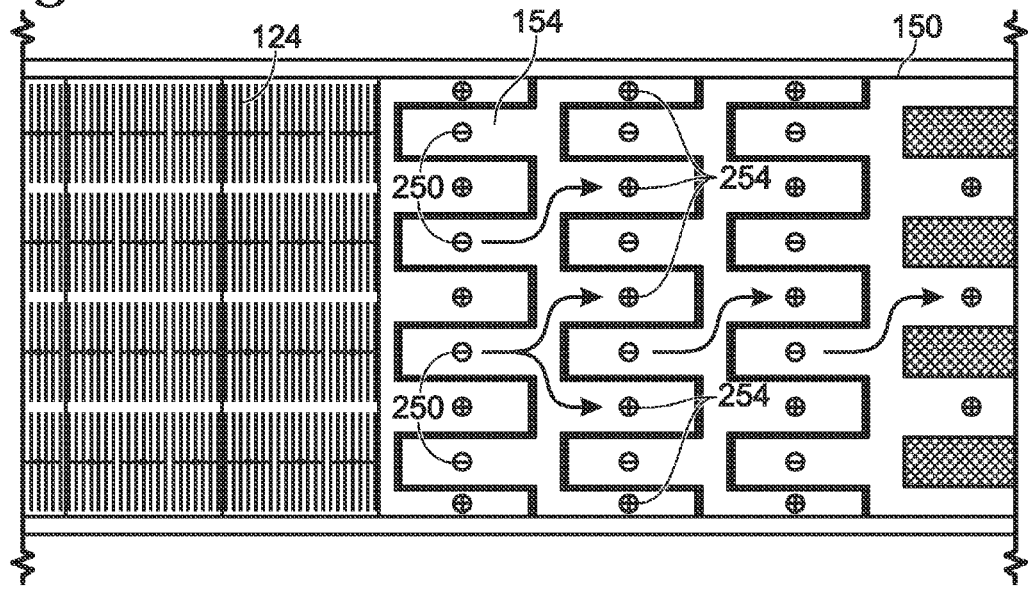
FIG. 11 is a top plan view of a photovoltaic module including integrated interconnection between cells, and an area which is partially cut away to show conductive paths through a metalized pattern on the back sheet of the module.
Figure 12:
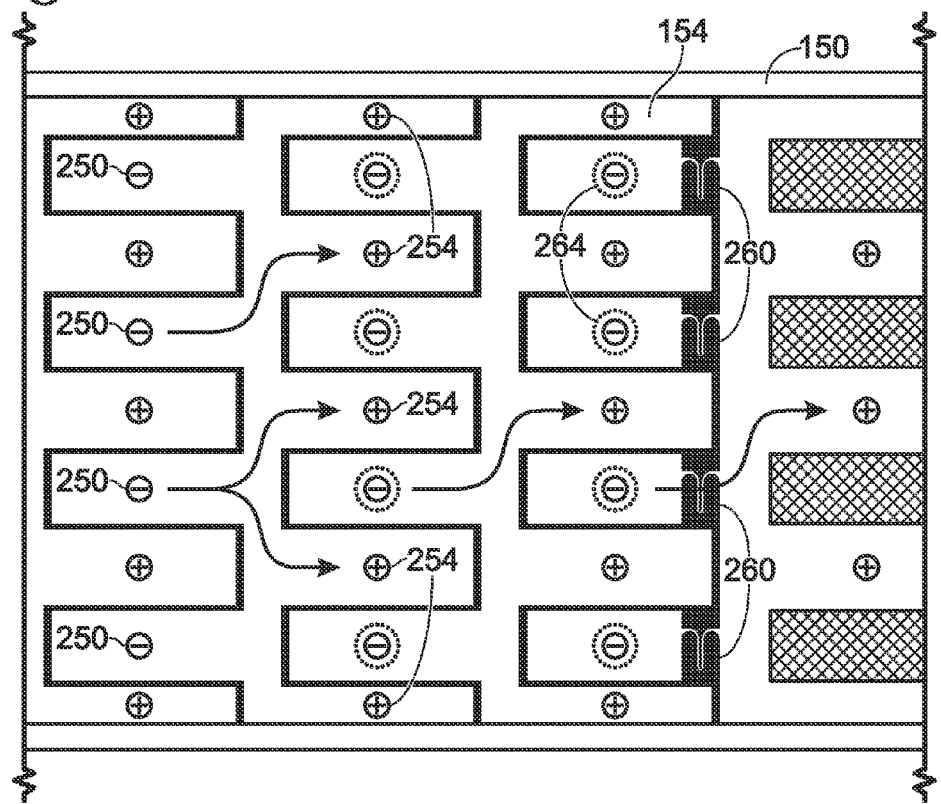
FIG. 12 is a top plan view of a back sheet including a metalized pattern, as shown in FIG. 11, with the addition of a spring mechanism for accommodating variable thermal expansion rates between different layers of the photovoltaic module.

FIGS. 11 and 12 show conductive grid 154 on back sheet 150 and illustrate conductive paths relative to interconnection of adjacent photovoltaic cells. As shown in FIG. 11, negative contact regions 250 are registered with respect to corresponding ECA conductors through vias in the photovoltaic web (not shown in FIG. 11). Negative contact regions 250 receive current from the top side grid, through vias, then conduct the current to positive contact regions 254 which are connected to the back (positive) contact of the adjacent cell. Dielectric layer 230 (FIG. 10) has openings corresponding to contact regions 250 and 254 to permit the desired interconnection of the series of cells in the photovoltaic module.

FIG. 12, again shows conductive grid 154 on back sheet 150, with the addition of spring structures 260 which are patterned out of metal, preferably copper, using the "etch resist" procedure, as described above. A multi-layered composite of different materials, as described herein, may experience problems due to variable thermal expansion rates of the different layers. For example, copper may expand or contract at a different rate with changing temperature, compared to front sheet 120, PV web 100, and back sheet 150. Spring structures 260 may allow some degree of tolerance or shifting of the copper layer relative to other layers without interrupting the conductive function of the back layer or the photovoltaic module as a whole. Also shown in FIG. 12 are apertures 264 provided around contact regions. Apertures 264 allow increased surface area for adhesion between back sheet 150 and overlying photovoltaic cells. It will be appreciated that other apertures or cut outs in grid 154 may be made in other locations, for example, around other contact regions to accomplish the same goal of increasing adhesion between the sheets.

As shown in the figures, back sheet grid 154 includes relatively large or expansive conduits compared to grid strips in grid 124 on the top side of the module. Grid strips on the front of the module must be relatively thin to allow sufficient transmissive area for sun to reach the photovoltaic cells. In contrast, there is no similar need for the back sheet with grid pattern to be transmissive. Accordingly, back sheet grid 154 uses relatively wide conduits which may decrease resistance.

FIG. 13 shows a flowchart illustrating process steps in an exemplary method of manufacturing a photovoltaic module. Method of manufacturing 300 is initiated by preparing a photovoltaic (PV) web 304, preferably in roll form. Preparation of a suitable PV web may be carried out, for example, using principles disclosed in U.S. Pat. No. 7,194,197 and/or in U.S. patent application Ser. No. 12/424,497, each of which is incorporated herein by reference. Next, vias or small holes or apertures, are cut 308 into the PV web along with linear cuts extending width-wise across most of the width of the PV web to define partially singulated photovoltaic cell regions along the web. In a subsequent step 312 dielectric material is applied around the vias which were cut in step 308.

In a subsequent or parallel step 316, a transmissive front sheet is prepared with a metalized, conductive, grid pattern applied on one side. The grid pattern includes sub-patterns corresponding to cell regions which were partially singulated in step 308. Next, in step 318, the front sheet is applied to the PV web, aligning the grid with cell regions, and with the vias cut in step 308. Edges of the PV web are then trimmed 322 to complete singulation of the PV cells.

In a subsequent or parallel set of steps 326, a back sheet is prepared having a metalized connection pattern. In step 330, electrically conductive adhesive (ECA) is applied over the vias on the underside of the PV web. In step 334 the back sheet is applied to the PV web and the front sheet forming a laminated package or module in which individual photovoltaic cells are interconnected in series, and protected between laminated front and back sheets. Step 338 involves testing cells by contacting exposed contact areas on the individual cells. Step 338 may be carried out during the manufacturing process prior to completing lamination of the entire package. After testing 338, terminal tape may be applied 342 to cover cell contacts and a return line which may, optionally, be provided in the PV module.

FIG. 14 shows a flow chart 350 including steps for installing a BIPV product, for example, such as one which may be manufactured according to the steps shown in FIG. 13. First, a roll of BIPV solar composite is provided 354. In step 358, the BIPV solar composite is partially unrolled along an exterior expanse of a building. A suitable length of the composite is attached to the building exterior. Attachment step 358 may involve nailing, stapling, adhesive binding, screwing, clamping, or any other suitable attachment mechanism. Next, in step 362, a selected corresponding pair of contacts are accessed. A suitable pair of contacts may include one contact on a particular photovoltaic cell, and another contact nearby exposing a portion of a return line. Finally, in step 366, conductive tape, or another suitable conductive material, is applied to the exposed pair of contacts, thereby completing electrical interconnection of a suitably lengthed photovoltaic module to a pair of contacts located near each other, on the same end or side of the module.

FIG. 15A shows photovoltaic web material 500, an unfinished portion of which (i.e., without any material removed) is manufactured according to prior teachings, for example, as disclosed in U.S. Pat. No. 7,194,197 which is incorporated by reference. Web 500 may, for example, be a metal back sheet coated on a top side with a combination of chemicals which produce a photoactive layer, for example, CIGS. As shown in FIG. 15A, scribe cuts 504 are made defining discreet cell areas. Scribe cuts 504 remove semiconductor (CIGS) material cleanly down to the back contact. Scribe cuts 504 define discreet cell regions 508. Each cell region 508 additionally has tab or pad areas 512 on a long edge. Tab areas or regions 512 create interconnection pads, the use of which will be shown and explained in more detail below.

FIG. 15B shows a close up view of scribe cut 504 and interconnection tab or pad 512. FIG. 15C shows a cross section through the web portion shown in FIG. 15A illustrating where photovoltaic material has been removed leaving behind exposed back contact layer 513.

FIG. 16A shows PV web 500, as shown in FIG. 15A, with the addition of cuts 518 which extend most of the way across the width of web 500 perpendicular to the long axis of the web. Cuts 518 are between adjacent cells 508 and go through the back contact sheet. Cuts 518 provide partial singulation of discreet cells 508. Partial singulation cuts 518 may be made for example using a laser process to cut across the web outside the scribed cell perimeter. FIG. 16B shows a close up of a portion of FIG. 16A showing the relative position of cut 518 relative to scribe cuts 504.

FIG. 17 shows front sheet 530 which is substantially transparent to permit sunlight to reach photovoltaic cells which will eventually be positioned behind front sheet 530. Metal grid pattern 534 is applied to one side of sheet 530. Grid pattern 534 includes multiple sub-patterns corresponding to respective cells. The configuration of grid 534 is designed to permit a maximum amount of light to pass through front sheet 530, while also functioning to harness or collect current from the top side of a respective PV cell. Grid 534 may be comprised of copper or silver, and includes interconnection tabs 538 for eventual interconnection with pads 512 which were previously described and shown in FIGS. 15A and 16A.

FIG. 18A shows front sheet 530 including conductive grid 534 and interconnection tabs 538, as described previously, with the addition of dielectric strips 546 applied over an edge of each sub-pattern of conductive collection grid 530. FIG. 18B shows a close up of a portion of front sheet 530 indicating the relative position of conductive strip 546 relative to an edge of a sub-pattern of grid 534.

Figure 19:
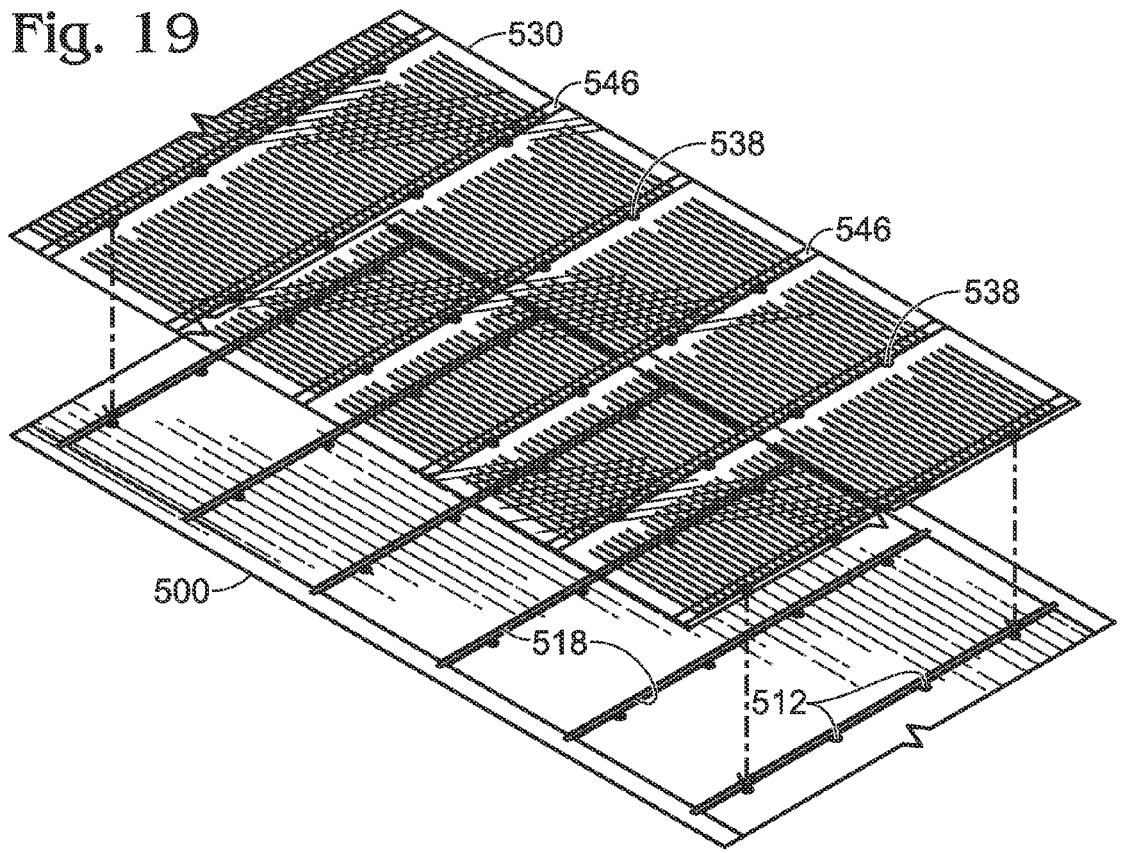
FIG. 19 is an exploded view illustrating registered assembly of the photovoltaic web to the front sheet.

FIG. 19 shows an exploded view of web 500 being laminated to front sheet 530. Sub-patterns of grid 534 are registered or aligned with cell regions 508 of web 500. As shown in more detail below, interconnection tabs 538 of grid 534 on front sheet 530 are registered with interconnection pads 512 on web 500.

Figure 20:
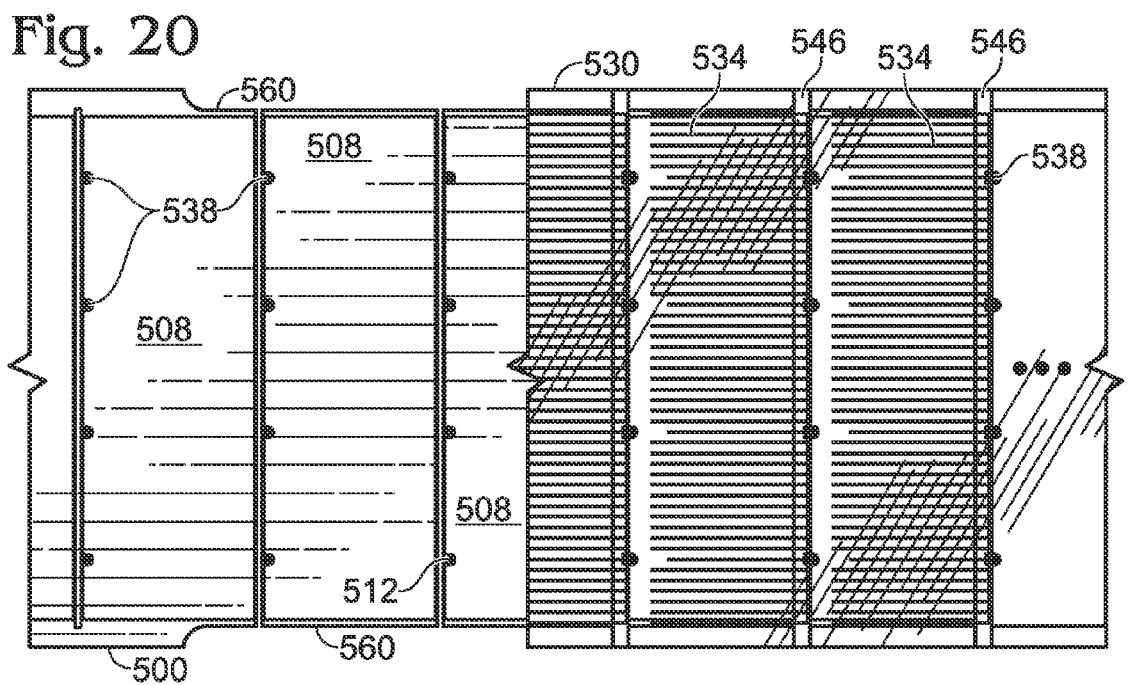
FIG. 20 is a top plan view of the photovoltaic web laminated to the front sheet with grid sub-patterns registered over respective cell areas.

FIG. 20 shows front sheet 530 laminated onto PV web 500. The two sheets have been "tac" laminated. For example, the two sheets may be tac laminated by heating selected locations of the composite, in which a heat sensitive layer, such as ionomer has been coated on a inner side of one or both of the substrates. As shown in FIG. 20, interconnection tabs 538 on grid 534 are registered relative to interconnection pads 512 which are essentially exposed regions of the back contact layer where photovoltaic material has been removed. Additional cuts 560 are made to trim the edges of web 500 which completes singulation of discreet and separate PV cells 508.

Figure 21:
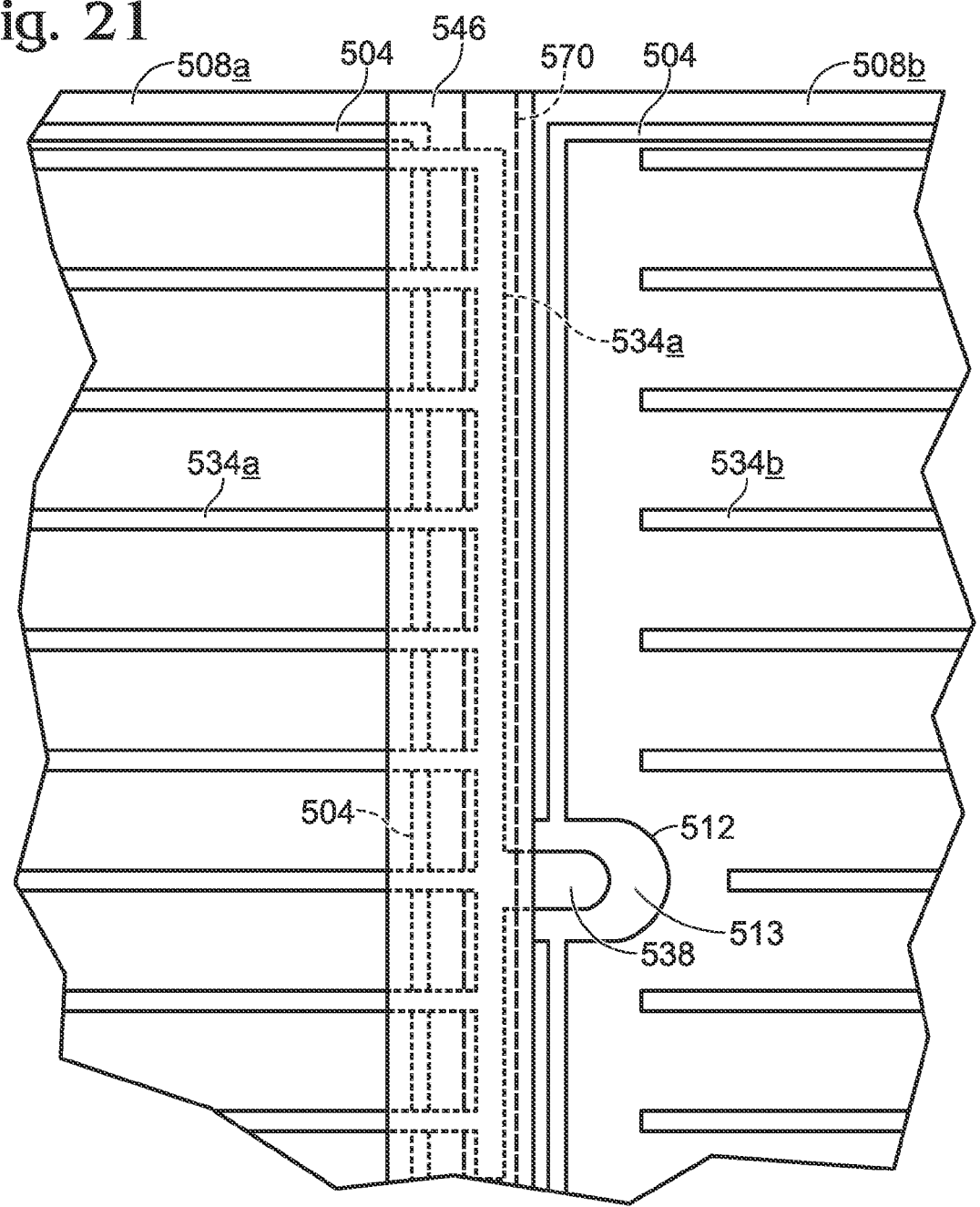
FIG. 21 is a partial magnified view of a portion of the laminated composite shown in FIG. 20, with certain internal structures drawn in dashed lines to illustrate interconnection concepts between adjacent cells.

FIG. 21 shows a portion of FIG. 20 with certain covered features drawn in dashed lines to show how various structures on web 500 and front sheet 530 are aligned in the interconnection region of the module. Scribe cuts 504 through the PV layer exposing the back contact sheet 513 of web 500. Interconnection tab 538 of grid 534 on front sheet of 530 is shown registered on interconnection pad 512. Note that interconnection tab 538 is significantly smaller than pad 512 to permit some degree of registration tolerance. PV cell expanses 508 are actually slightly larger than the area circumscribed by scribe cuts 504. Gap 570 is defined between adjacent cell expanses 508a and 508b. Grid 534a extends beyond the edge of respective cell expanse 508a, into gap 570 between cells 508a and 508b. Dielectric strip 546 covers the edge of cell expanse 508a, the edge of conductive grid 534a, and the adjacent edge of cell 504b. It can be seen from FIG. 21 how grid 534a conducts current from the top (sunny) side of cell 508a to the back contact 572 of cell 508b, via interconnection tab 538 and pad 512.

Figure 22:
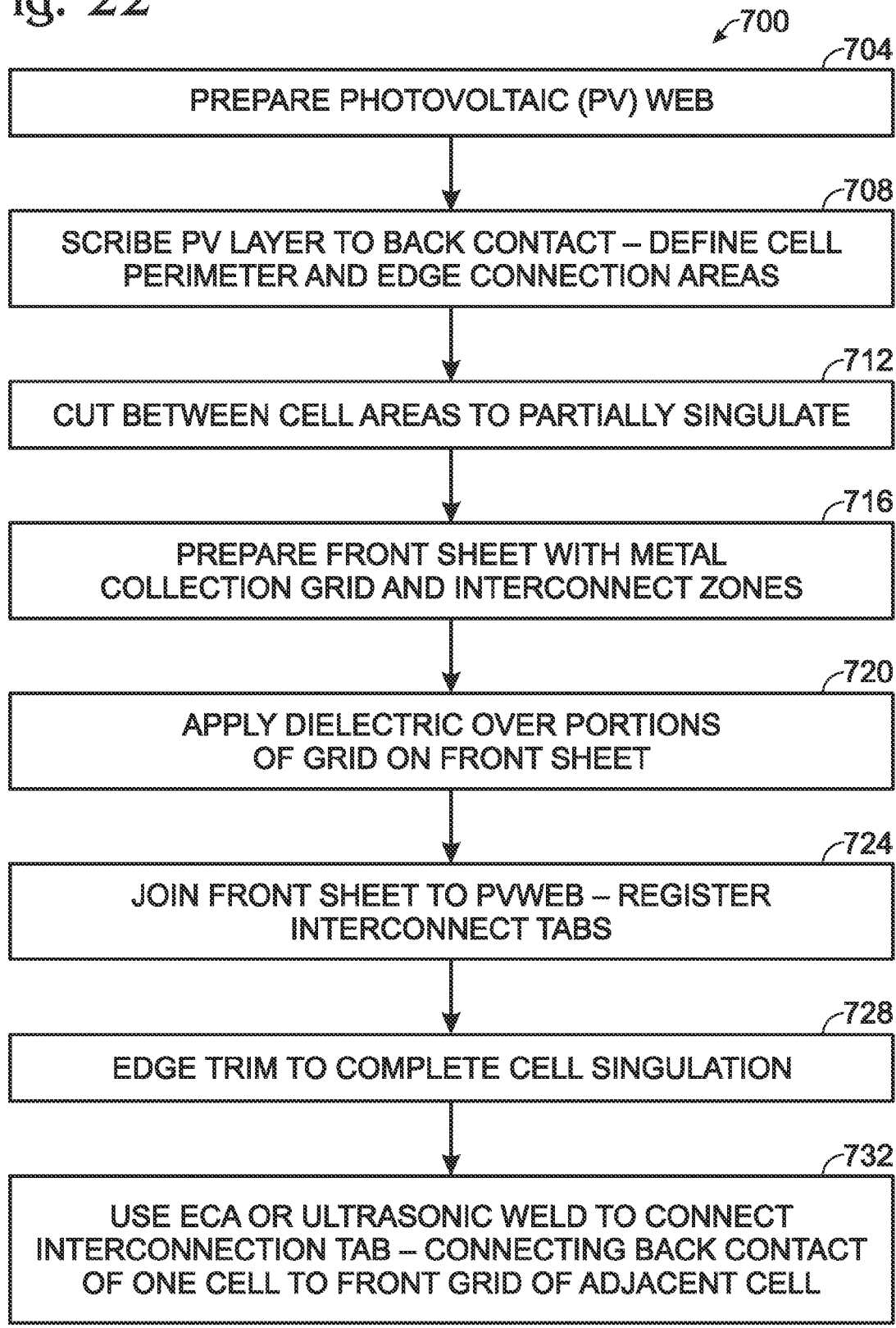
FIG. 22 is a flow chart illustrating steps in a process for manufacturing a photovoltaic module with integrated cell interconnection structures.

FIG. 22 shows a flow chart 700 for illustrating steps in a process for manufacturing a photovoltaic module in accordance with concepts described above. Process 700 begins with preparation 704 of a photovoltaic (PV) web material in accordance with principles described in U.S. Pat. No. 7,194,197, and in U.S. patent application Ser. No. 12/424,497, both of which are incorporated by reference in their entirety. Subsequently, in step 708 the PV layer on the PV web is scribe cut down to the back contact, thus defining perimeters of individual photovoltaic cells, and edge connection areas or pads. Next, width-wise cuts are made 712 between cell areas to partially singulate discrete cells.

In a subsequent or parallel set of steps, a front sheet is prepared 716 with metal collection grid and interconnect zones. Then dielectric strips are applied 720 over portions of the grid on the front sheet. Subsequently, the front sheet is joined 724 to the PV web. Interconnect tabs on the grid of the front sheet are registered with respect to interconnect zones or pads on the PV web material. Next, the edge regions of the photovoltaic web are trimmed 728 to complete singulation of discrete cells. Finally, electrically conductive adhesive (ECA) or ultrasonic welding is used to connect 732 interconnection tabs of the grid on the front sheet, to the back contact pads of the PV web, thus establishing electrical interconnection between opposite sides of adjacent cells. A protective back sheet may then be applied on the back side of the PV web for protective purposes.

The methods described above and shown in FIGS. 13, 14, and 22 may be modified in many different ways for various purposes. For example, subcombinations of the steps may be practiced independently or in conjunction with other steps or methods. Additional steps may be added. Steps may be deleted, and the order of steps may be modified in accordance with the principles described in this disclosure.

The method illustrated in FIG. 22 provides a roll-to-roll process for serially connecting thing film, flexible PV solar cells in the "downweb" or "machine direction." A single polymer web front sheet may be any length, and may be patterned with a conductive collecting grid only on one side, applied only on the front (light-incident) side of the PV web. The grid may contact the light-incident PV cell surface of one polarity, with selected portions of the grid contacting the opposite polarity substrate of an adjacent cell on the front side through a region where the PV material has been removed by laser ablation, for example. The connection regions may be created by removing PV material using mechanical or chemical methods. The process may be carried out by handling the PV material and the front sheet as continuous webs by fully singulating the PV cells only after they are joined to the continuous front sheet. Dielectric insulating regions may be printed over selected areas of the conductive collection grid to prevent undesirable shunting. Dielectric insulating regions may also be printed over selected areas of the PV cells to prevent undesirable shunting. Buss areas including conductive regions of the conductive collection grid may be placed over the gaps between PV cells to minimize active area loss. The printed dielectric may be substantially transparent to avoid shading losses. Laser processes may be used for selective removal of the PV material to expose connection regions to the substrate, and to electrically isolate defective areas of the cells such as cut edges, by cleanly cutting the PV layers. A laser process may be used to cut the PV cell and substrate for cell singulation. The conductive collection grid patterned on the polymer front sheet may be formed using multiple, discrete lengths of metal wire or ribbon placed and adhered to the front sheet. Electrical interconnections may be made between the grid conductors on the front sheet and the selected exposed substrate areas using ultrasonic welding, or ECA.

While the concepts discussed above have been described primarily in the context of flexible substrates having thin film CIGS photovoltaic layers, it should be understood that many of the concepts may also be readily used advantageously with other thin film devices and processes, for example, based on cadmium telluride, as well as rigid silicon based photovoltaic devices.

The various structural members disclosed herein may be constructed from any suitable material, or combination of materials, such as metal, plastic, nylon, rubber, or any other materials with sufficient structural strength to withstand the loads incurred during use. Materials may be selected based on their durability, flexibility, weight, and/or aesthetic qualities.

It is believed that the following claims particularly point out certain combinations and subcombinations that are directed to one of the disclosed inventions and are novel and non-obvious. Inventions embodied in other combinations and subcombinations of features, functions, elements and/or properties may be claimed through amendment of the present claims or presentation of new claims in this or a related application. Such amended or new claims, whether they are directed to a different invention or directed to the same invention, whether different, broader, narrower or equal in scope to the original claims, are also regarded as included within the subject matter of the inventions of the present disclosure.

What is claimed is:

1. A method of manufacturing a photovoltaic module, comprising:
   preparing photovoltaic web material including a photoactive top layer formed of semiconductor material and a metal back sheet;
   scribing the web material by removing semiconductor material down to the back sheet, to define a plurality of discrete cell regions and a plurality of discrete interconnection pad areas disposed on a long edge of each cell region;
   cutting entirely through the web material between adjacent cell regions;
   applying a conductive grid pattern to a transparent front sheet, the grid pattern including multiple sub-patterns corresponding to the discrete cell regions and a plurality of discrete interconnection tabs corresponding to the pad areas of each cell region; and
   laminating the web material to the transparent front sheet with each grid sub-pattern aligned with one of the cell regions so that each interconnection tab of the grid pattern is registered with a corresponding interconnection pad area of one of the cell regions, thereby connecting adjacent cell regions in electrical series.

2. The method of claim 1, further comprising applying dielectric strips over an edge of each sub-pattern, each dielectric strip partially overlapping the interconnection tabs of a particular cell region.

3. The method of claim 1, wherein cutting entirely through the web material between adjacent cell regions includes forming cuts that extend most of the way across the web material in a direction perpendicular to a long axis of the web, and further comprising trimming edge regions of the web material to complete singulation of discrete cells, after laminating the web material to the transparent front sheet.

4. The method of claim 1, further comprising welding the interconnection tabs to the interconnection pad areas.

5. The method of claim 1, further comprising connecting the interconnection tabs to the interconnection pad areas with electrically conductive adhesive.

6. The method of claim 1, wherein the interconnection tabs are smaller than the interconnection pads to permit registration tolerance.

7. A method of manufacturing a photovoltaic module, comprising:
   preparing a continuous roll of photovoltaic web material including a photoactive top layer and a conductive back sheet;
   removing semiconductor material down to the back sheet, to define a plurality of substantially rectangular discrete cell regions each having a pair of short edges and a pair of long edges, and a plurality of discrete interconnection pad areas disposed on one of the long edges of each cell region;
   cutting entirely through the web material between long edges of adjacent cell regions without completely separating the adjacent cell regions;
   applying a conductive grid pattern to a transparent front sheet, the grid pattern including multiple sub-patterns corresponding to the discrete cell regions and a plurality of interconnection tabs corresponding to each of the interconnection pad areas; and
   attaching the web material to the transparent front sheet with each interconnection tab of the grid pattern registered with a corresponding interconnection pad area of one of the cell regions, to create a plurality of discrete electrical series connections between each pair of adjacent cell regions.

8. The method of claim 7, further comprising applying dielectric strips over an edge of each sub-pattern, each dielectric strip partially overlapping the interconnection tabs corresponding to a particular cell region.

9. The method of claim 7, wherein cutting entirely through the web material between adjacent cell regions includes forming cuts that extend most of the way across the web material in a direction perpendicular to a long axis of the web, and further comprising trimming edge regions of the web material to complete singulation of discrete cells, after laminating the web material to the transparent front sheet.

10. The method of claim 7, further comprising welding the interconnection tabs to the interconnection pad areas.

11. The method of claim 7, further comprising connecting the interconnection tabs to the interconnection pad areas with electrically conductive adhesive.

12. The method of claim 7, wherein the interconnection tabs are smaller than the interconnection pads to permit registration tolerance.

* * * * *